United States Patent [19]
Kumagai et al.

[11] Patent Number: 5,796,307
[45] Date of Patent: Aug. 18, 1998

[54] AMPLIFYING DEVICE HAVING INPUT AND OUTPUT NONLINEAR PHASE SHIFTERS OF OPPOSITE PHASE-FREQUENCY CHARACTERISTICS

[75] Inventors: Ken Kumagai, Yokohama; Toshio Nojima; Shoichi Narahashi, both of Yokusuka, all of Japan

[73] Assignee: NTT Mobile Communications Network Inc., Tokyo, Japan

[21] Appl. No.: 749,240

[22] Filed: Nov. 14, 1996

[30] Foreign Application Priority Data

Nov. 16, 1995 [JP] Japan .................. 7-298684
Dec. 12, 1995 [JP] Japan .................. 7-323364
Dec. 12, 1995 [JP] Japan .................. 7-323365

[51] Int. Cl.⁶ .................................. H03F 1/26
[52] U.S. Cl. .................................. 330/149; 330/151
[58] Field of Search .......................... 330/107, 124 R, 330/129, 149, 151, 302; 327/231, 232, 233

[56] References Cited

U.S. PATENT DOCUMENTS

| | | | |
|---|---|---|---|
| 3,725,806 | 4/1973 | Darlington | 330/149 |
| 4,394,624 | 7/1983 | Bauman | 330/151 |
| 4,943,783 | 7/1990 | Nojima | 330/149 |
| 5,363,056 | 11/1994 | Blauvelt | 330/151 X |
| 5,365,187 | 11/1994 | Hornak et al. | 330/151 X |

FOREIGN PATENT DOCUMENTS 0 451 909  10/1991  European Pat. Off.

*Primary Examiner*—Steven Mottola
*Attorney, Agent, or Firm*—Pollock, Vande Sande & Priddy

[57] ABSTRACT

An input signal is applied to a first phase shifter whose phase shift amount-vs.frequency characteristic is a square-law characteristic, then the output from the first phase shifter is amplified by an amplifier, and the amplified output is applied to a second phase shifter which has a phase shift amount-vs.-frequency characteristic that is substantially inverse to that of the first phase shifter, thereby obtaining an amplified output signal from the second phase shifter.

32 Claims, 21 Drawing Sheets

Sin

INPUT OF 1ST SHIFTER

OUTPUT OF 1ST SHIFTER

INPUT OF 2ND SHIFTER

OUTPUT OF 2ND SHIFTER

AMPLIFYING DEVICE HAVING INPUT AND OUTPUT NONLINEAR PHASE SHIFTERS OF OPPOSITE PHASE-FREQUENCY CHARACTERISTICS

BACKGROUND OF THE INVENTION

The present invention relates to an amplifying device which is used as a multicarrier amplifier for mobile communication, satellite communication and broadcasting systems, for instance, and is suitable for the amplification of signals whose peak envelope power (hereinafter identified as PEP) is significantly larger than the average power.

A transmitting apparatus for communication and broadcasting in the microwave band, for instance, calls for the amplification of multicarrier signals of a band ranging from several MHz to about 10 MHz. In FIG. 1 there is schematically shown the spectrum of the multicarrier signal. The multicarrier signal spectrum is composed of first through N-th channel #1 to #N in each of which a spectral broadening by a modulating signal is formed centering about one of N carrier signals. Usually, the channels are equally spaced, and the multicarrier signal has a bandwidth which covers the first to N-th channels, and the center of the band is a center frequency $f_0$. With this multicarrier signal, there is a possibility that the PEP remarkably increases up to a value of multiplication of the average power by the number (N) of carriers, depending on the amplitude and phase of the carrier in each channel. This causes an increase in the required saturated output power that is used in the transmitting apparatus, constituting a serious obstacle to downsizing of the transmitting apparatus and reduction of its power consumption.

As a solution to this problem, it has been proposed to make the initial phases of respective carriers bear specific relationships (for example, D. R. Gimlin, et al., "On Minimizing the Peak-to-Average Power Ratio for the Sum of N Sinusoids," IEEE TRANSACTIONS ON COMMUNICATIONS, VOL. 41, NO. 4, Apr., 1993, pp. 631–653). However, this method is effective only when the carriers have not been modulated. That is, the carriers remain intact as sine-wave carriers, and when they are each modulated by a modulating signal, the specified initial phase relationship breaks up, allowing large PEP to develop.

A feedforward amplifier is known that is suitable for low-distortion amplification of such a multicarrier signal mentioned above. The feedforward amplifier is described, for example, in U.S. Pat. No. 5,166,634 issued on Nov. 24, 1992. The conventional feedforward amplifier will briefly be described with reference to FIG. 2.

A signal Sin fed to an input terminal 1 is divided by a power divider 2 to a main amplifying path composed of a variable attenuator means 3, a variable phase shifter means 4 and a main amplifier 5 and a linear path 15 with delay means 6 inserted therein. The signals thus fed to the paths 14 and 15 are input into a directional coupler 7, from which the signal from the main amplifying path 14 is output intact onto a main signal path 16 and a main amplifier distortion component is output onto a distortion amplifying path 17 as described later on. The main signal path 16 includes delay means 8, and the distortion amplifying path 17 includes variable attenuator means 9, variable phase shifter means 10 and an auxiliary amplifier 11. The signals that pass through the main signal path 16 and the distortion amplifying path 17 are combined by power combining means 12 and the combined output is provided to an output terminal 13.

The variable attenuator means 3 and the variable phase shifter means 4 are adjusted so that the signals from the main amplifying path 14 and the linear path 15 are coupled together in opposite phases (18° out of phase) by the directional coupler 7, providing the distortion component by the main amplifier 5 onto the distortion amplifying path 17. The variable attenuator means 9 and the variable phase shifter means 10 are adjusted so that the distortion component contained in the signal of the main signal path 16 and the distortion component amplified by the auxiliary amplifier 11 are added together in opposite phases by the power combining means 12, providing a distortion-free signal to the output terminal 13. The distortion by the main amplifier 5 falls roughly into a distortion due to the incompleteness of its linear region and a distortion by its saturation characteristic. The feedforward amplifier has a configuration in which all the distortion components generated by the main amplifier 5 can be detected in a distortion detecting part 18 from the input terminal 1 to the directional coupler 7 and the above-mentioned distortion can be removed. It is essential, however, that the auxiliary amplifier 11 linearly operate.

It is an object of the present invention to provide an amplifying device which permits linear amplification of a signal whose peak envelope power becomes markedly large, such as a multicarrier signal.

Another object of the present invention is to provide a relatively-simple-structured, small and low-cost amplifying device which attains the above object and permits the use of an amplifier of a relatively small saturated output power.

SUMMARY OF THE INVENTION

According to an aspect of the present invention, the input signal is input into a first phase shifter means which has a nonlinear phase shift amount-vs.-frequency characteristic, then the output from the first phase shifter means is amplified by an amplifier, and the amplified output is input into second phase shifter means which has a phase shift amount-vs.-frequency characteristic inverse to that of the first phase shifter means, and from which the amplified output of the input signal is provided.

According to another aspect of the present invention, a main signal and a difference signal are derived by signal separator means from the input signal, the main signal is fed to a first signal path and the difference signal is fed to a second signal path including the first phase shifter means, the amplifier and the second phase shifter means, then the outputs from the first and second signal paths are combined by first power combining means, from which the combined output is provided to an output terminal.

The signal separator means is formed by a distortion detecting part in the feedforward amplifier, and a distortion removing part is formed by the first and second signal paths and the first power combining means.

Alternatively, the signal separator means is a means for separating the input signal into a main signal whose envelope power is limited to a predetermined value or smaller and a difference signal which is the difference between the main signal and the input signal, and a main amplifier is inserted in the first signal path. The signal separator means in this instance is formed by analog or digital techniques.

According to still another aspect of the present invention, first switching means is interposed between the input terminal and the input of the amplifier to selectively apply the input signal to either one of a first input path and a second input path with the first phase shifter means inserted therein, and second switching means is interposed between the amplifier and the output terminal to selectively apply the amplifier output to either one of a first output path and a second output path with the second phase shifter means inserted therein. When the envelope power of the input signal is detected by detecting means, and when the detected envelope power exceeds a threshold value, the first and second switching means are controlled by control means to pass the input signal to the second input path and the amplifier output to the second output path.

DESCRIPTION OF THE PREFERRED EMBODIMENTS

Figure 3:
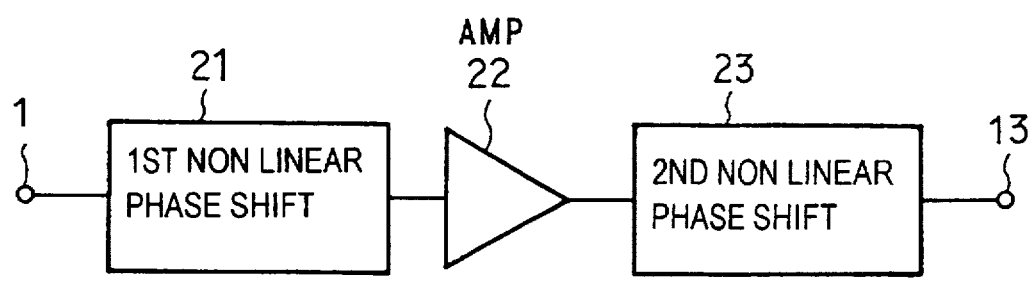
FIG. 3 is a block diagram illustrating the basic structure of the present invention.
Figure 4:
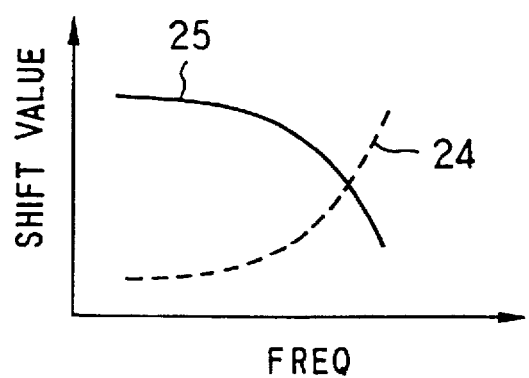
FIG. 4 is a graph showing examples of the phase shift amount-vs.-frequency characteristics of first and second phase shifter means in FIG. 3.

In FIG. 3 there is illustrated the basic construction of the present invention. The input signal from the input terminal 1 is fed via first phase shifter means 21 to an amplifier 22, the amplified output of which is provided via second phase shifter means 23 to the output terminal 13. The phase shift amounts of the first and second phase shifter means 21 and 23 vary nonlinearly with respect to frequency, and their variation characteristics are opposite to each other as indicated by the curves 24 and 25 in FIG. 4, for instance. The first phase shifter means 21 uses, as its phase shift amount-vs.-frequency characteristic, the square-law characteristic (a characteristic proportional to the square of the difference frequency with respect to a reference frequency) given by the following equation, for instance:

$$\Psi(f) = -\alpha(f-f_0)^2$$

where $\alpha$ is a coefficient of the squared characteristic. In the above equation, the phase shift amount $\Psi(f)$ is a value relative to the phase shift amount at the frequency $^\circ$. This phase characteristic is employed in a chirp filter for use in a chirp radar, or an initial phase setting scheme which reduces the peak-to-average power ratio (PAPR), defined as the ratio of the peak envelope power (PEP) to the average power of a multitone signal. In the chirp filter the coefficient $\alpha$ can be expressed as follows:

$$\alpha = \pi T/B$$

where T is the period of a chirp signal and B its frequency band. Letting T be the period of a sinusoidal multicarrier signal (if the carrier frequency interval is represented by $\Delta f$, $T=1/\Delta f$), the above equation is an example of a phase setting equation in the above-mentioned phasing scheme.

Figure 5A:
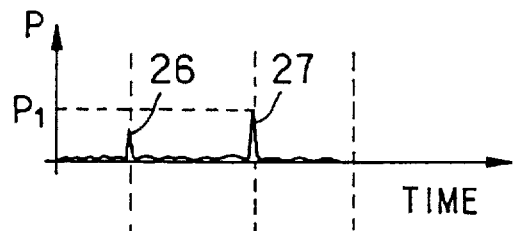
FIGS. 5A–5D (hereinafter collectively referred to as "FIG. 5") are waveform diagrams showing examples of signal envelope power waveforms occurring at respective parts in FIG. 3.
Figure 5B:
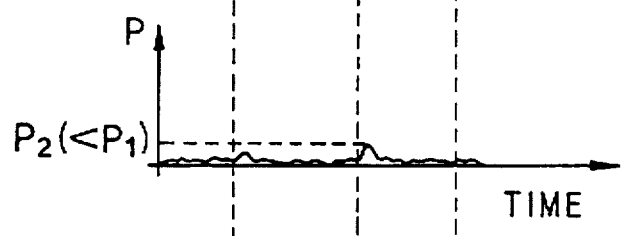
Figure 5C:
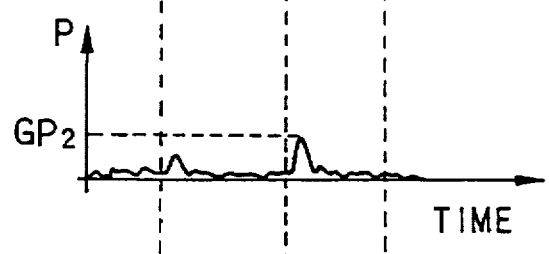
Figure 5D:
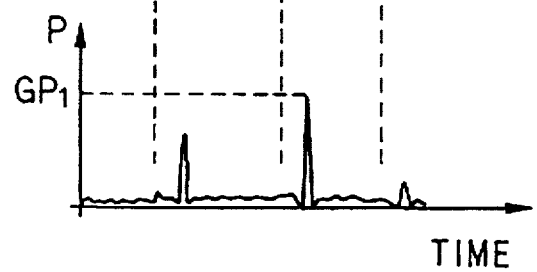

With such a construction, even if the input signal to the input terminal 1 has such large peaks 26 and 27 as shown in FIG. 5A, each frequency component of the input signal undergoes a different phase shift in the first phase shifter means 21, that is, the respective frequency components are displaced apart in phase, and the peaks 26 and 27 in the input signal become small in the output signal from the first phase shifter means 21 as shown in FIG. 5B. The signal with no large peaks is amplified by the amplifier 22 as depicted in FIG. 5C. This reduces the saturation power required of the amplifier 22 and hence enables the amplifier 22 to be formed small at low cost. The output signal amplified by the amplifier 22 is fed to the second phase shifter 23, wherein its respective frequency components are phase shifted with a characteristic inverse to that of the first phase shifter means 21; namely, the sums of the phase shift amounts of the respective frequency components by the thirst and second phase shifter means 21 and 23 become equal to each other and the relative phase of each frequency component of the output signal from the second phase shifter means 23 becomes the same as the relative phase of the corresponding frequency component of the input signal to the first phase shifter means 21. FIG. 5D shows the output signal from the second phase shifter means 23, which is substantially identical in waveform with the input signal waveform shown in FIG. 5A and has been amplified G (the gain of the amplifier 22) times larger than the input signal.

Figure 6A:
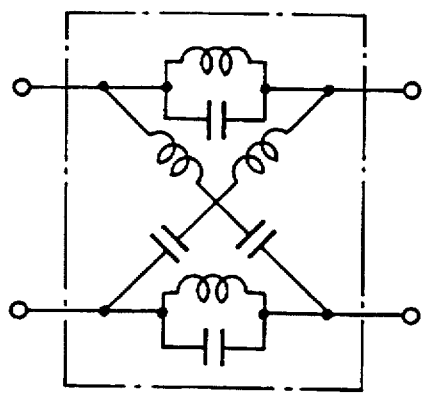
FIG. 6A is a diagram showing a second-order delay equalizer formed by a reactance circuit.
Figure 6B:
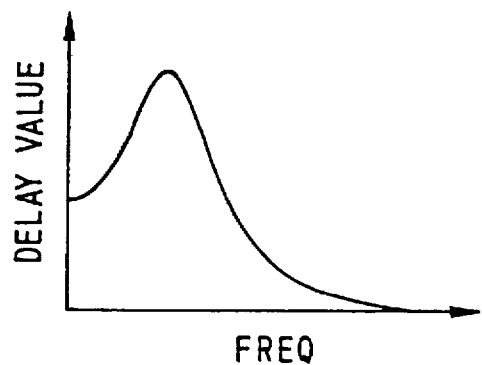
FIG. 6B is a graph showing an example of the delay-vs.-frequency characteristic of the secondary delay equalizer depicted in FIG. 6A.
Figure 6C:
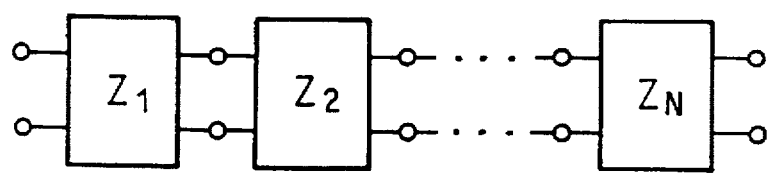
FIG. 6C is a block diagram illustrating an example of phase shifter means formed by a series connection of such secondary delay equalizers as shown in FIG. 6A.

Next, concrete examples of the first and second phase shifter means 21 and 23 will be described. A secondary delay equalizer formed by a reactance circuit shown in FIG. 6A, for instance, has such a frequency characteristic of delay as shown in FIG. 6B. Hence, by connecting in cascade such reactance circuits (secondary delay equalizers) Z1 to Zn as shown in FIG. 6C and by selecting characteristics of these circuits Z1 to Zn, it is possible to form a nonlinear phase shifter which has a characteristic approximate to that required of the first or second phase shifter means 21 or 23.

Figure 7A:
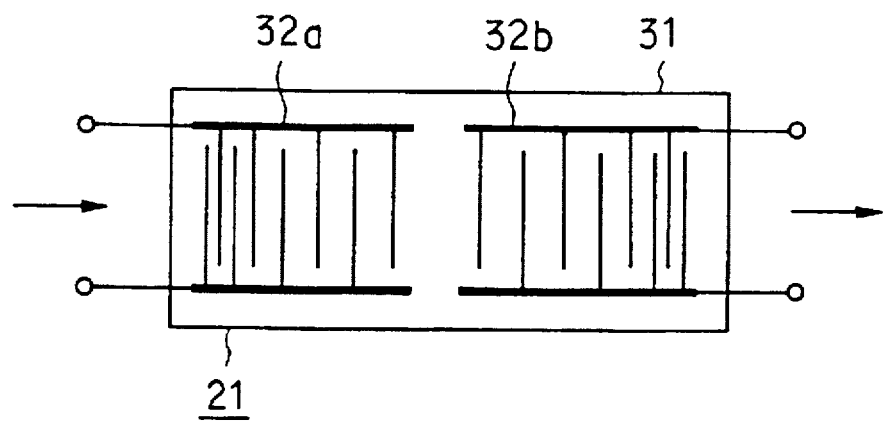
FIG. 7A is a plan view showing an example of first phase shifter means 21 formed by a dispersive delay line.
Figure 7B:
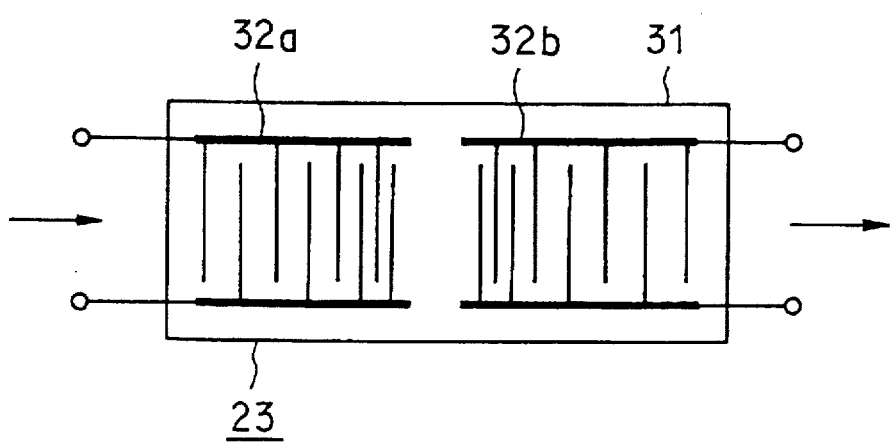
FIG. 7B is a plan view showing an example of second phase shifter means 23 formed by a distributed delay line.

The phase shifter means 21 and 23 may also be formed by distributed delay lines. FIG. 7 shows an example in which the distributed delay line is formed by a surface acoustic wave circuit. In this instance, the surface acoustic wave circuit has two sets of interdigital electrodes 32a and 32b formed on a piezoelectric substrate 31, and the signal applied to the interdigital electrodes 32a is converted to a surface acoustic wave on the piezoelectric substrate 31, which propagates through the piezoelectric substrate 31 to the other interdigital electrodes 32b, wherein it is converted to an electric signal. In this case, the inter-electrode pitches of the interdigital electrodes 32a and 32b gradually change in the direction of propagation of the surface acoustic wave but in opposite directions. When the first chase shifter means 21 uses the electrode structure shown in FIG. 7A, the second phase shifter means 23 uses the electrode structure of FIG. 7B whose electrode pitch changes in the direction opposite to that in the case of the first phase shifter means 21. Of course, the directions of change can be exchanged.

Figure 8A:
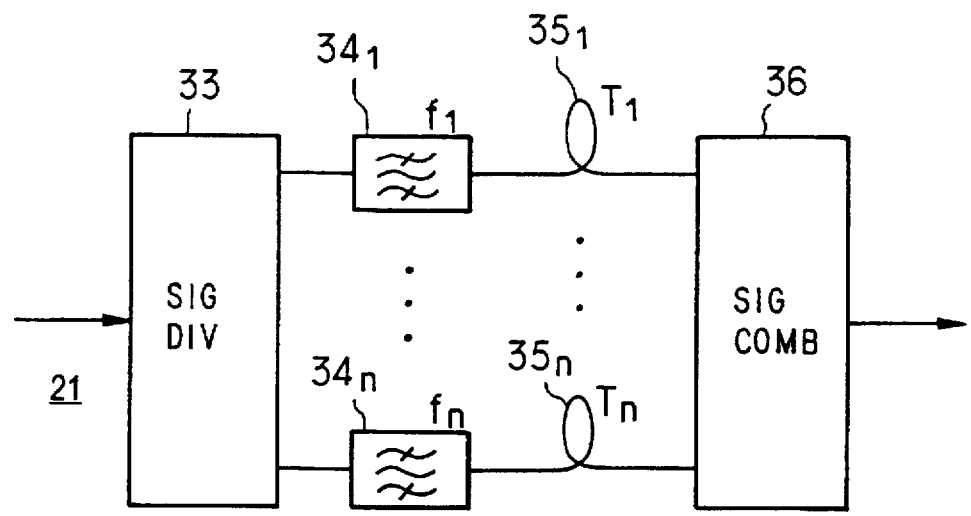
FIG. 8A is a block diagram illustrating another example of the configuration of the first phase shifter means 21.
Figure 8B:
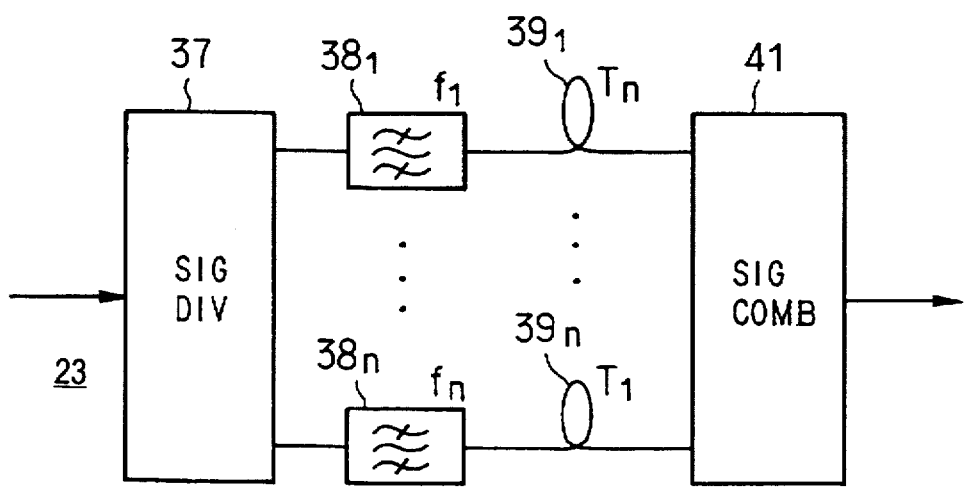
FIG. 8B is a block diagram, corresponding to FIG. 8A, showing an example of the configuration of the second phase shifter means 23.

Other examples of the phase shifter means 21 and 23 are shown in FIGS. 8A and 8B. In the phase shifter means 21 shown in FIG. 8A, the input signal is branched by signal branching means (signal divider) 33 into n and separated by band-pass filters $34_1$ to $34_n$ of center frequencies $f_1$ to $f_n$ into signals of respective frequency bands, which are delayed by delay lines $35_1$ to $35_n$ at fixed time intervals $T_1$ to $T_n$, respectively, thereafter being combined by signal combining means 36. Also in the phase shifter means 23 shown in FIG. 8B, the input signal is branched by signal branching means 37 into n and separated by band-pass filters $38_1$ to $38_n$ of center frequencies $f_1$ to $f_n$ into signals of respective frequency bands, which are delayed by delay lines $39_1$ to $39^n$, at fixed time intervals $T_n$ to $T_1$, respectively, thereafter being combined by power combining means 41. In this case, provision is made so that the sum of the delay times of the delay lines $35_i$ and $39_i$ (where i=1, 2, . . . , n) is $T_1+T_n$.

Figure 1:
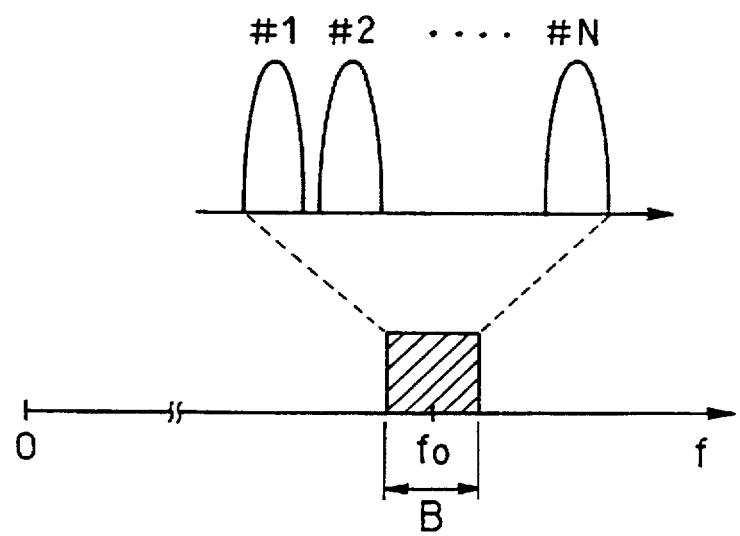
FIG. 1 is a diagram showing an example of the spectrum of a multicarrier signal.
Figure 2:
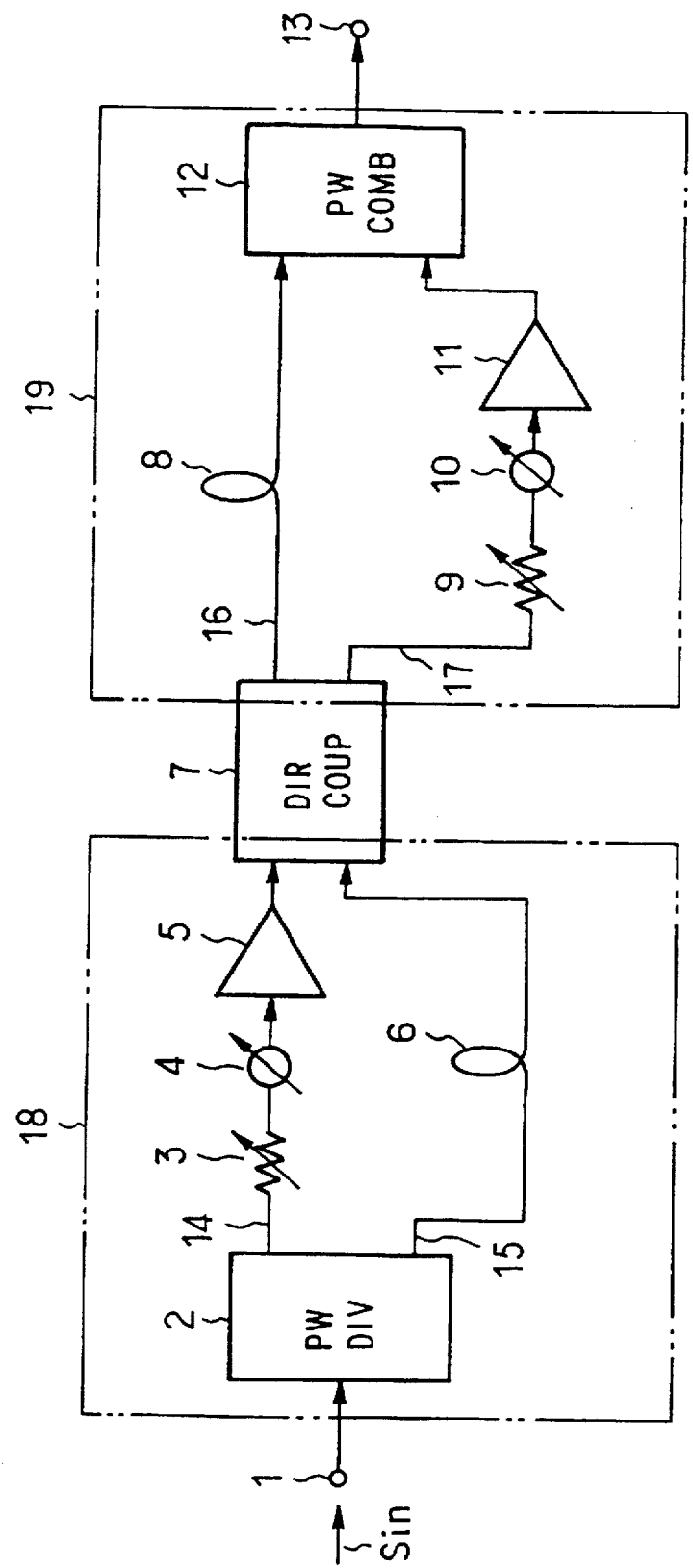
FIG. 2 is a block diagram illustrating the configuration of a conventional feedforward amplifier.
Figure 9:
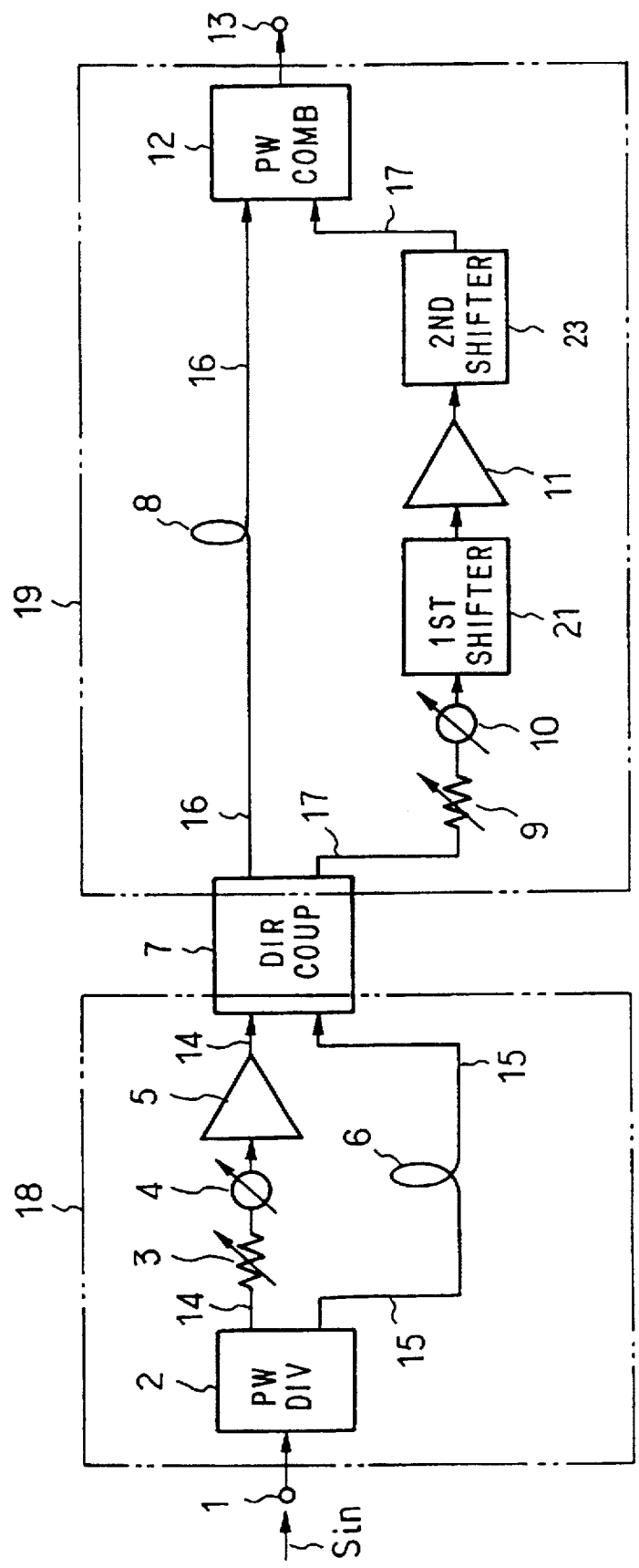
FIG. 9 is a block diagram illustrating an embodiment of the present invention applied to a feedforward amplifier.

In the embodiment of FIG. 3, when the PEP of the input signal to the input terminal 1 is relatively small, the PEP may sometimes be made large by the first phase shifter means 21. In view of this, it is to be wished that the present invention be effective only for signals of large PEP. In the prior art feedforward amplifier (FIG. 2), when the PEP in the input signal at the input terminal 1 is significantly large, that is, when the PEP greatly exceeds the saturation power of the main amplifier 5, distortion occurs markedly, causing a significantly large increase in the PEP of the difference signal between the output signal from the main amplification path 14 and the output signal from the linear path 15 which is applied to the distortion amplification path 17. Hence, the application of the present invention to the distortion amplification path 17 will ensure high performance of the feedforward amplifier. Turning next to FIG. 9, the present invention will be described as being applied to the feedforward amplifier, the parts corresponding to those in FIG. 2 being identified by the same reference numerals. This embodiment is identical in construction with the FIG. 2 example except for the application of the invention. In this embodiment the first and second chase shifter means 21 and 23 are ones whose phase shift amounts vary nonlinearly with respect to frequency. A description will be given below of the illustrated amplifying apparatus.

Figure 10A:
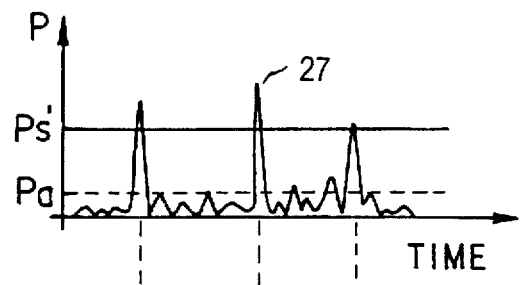
FIGS. 10A–10E (hereinafter collectively referred to as "FIG. 10") are waveform diagrams showing examples of signal envelope power waveforms occurring at respective parts in FIG. 9.

FIG. 10A shows an example of the waveform of the envelope power P of the input signal Sin at the input terminal 1. In the multicarrier signal, depending on the conditions of the amplitude and phase of each carrier, the PEP of the signal remarkably increases with respect to the average power Pa, and when the envelope power P of the input signal Sin far exceeds an input level Ps' corresponding to the saturation output Ps of the main amplifier 5, a component of large instantaneous envelope power is fed to the distortion amplification path 17.

Figure 10B:
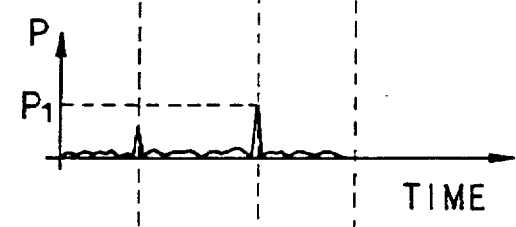
Figure 10C:
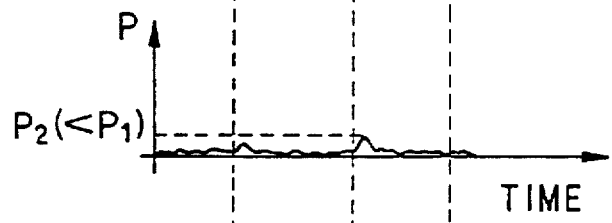

In the input to the first phase shifter means 21, as shown in FIG. 10B, there exists a distortion component in steady state which occurs due to the incompleteness of the linear region of the main amplifier 5, but at the time the envelope power P of the input signal Sin exceeds the input converted value Ps' of the saturation output, a large peak power develops. To achieve a low-distortion operation of the feedforward amplifier, a linear operation is required of the auxiliary amplifier 11. Thus, in order to compensate for distortion of a high-level peak power which is caused by the saturation characteristic of the main amplifier 5 as mentioned above, it is necessary in the prior art that the required saturation power of the auxiliary amplifier 11 be set at a considerably large value. According to the present invention however, the respective frequency components of the input signal, shown in FIG. 10B, are phase shifted by the phase shifter means 21, and at its output side the peak power decreases as depicted in FIG. 10C. That is, the peak power decreases at the input side of the auxiliary amplifier 11 and its required saturation output can be reduced accordingly.

Figure 10D:
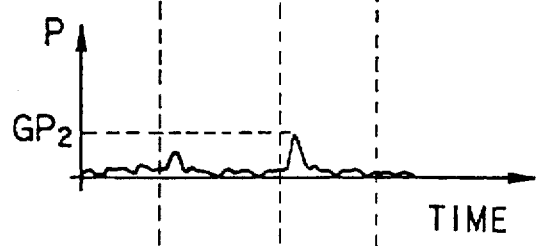
Figure 10E:
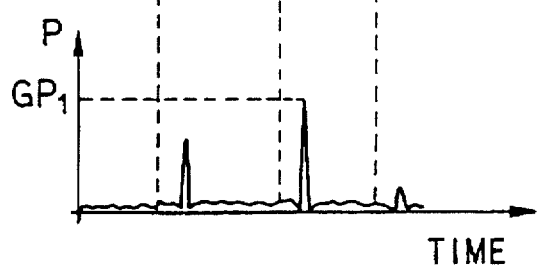

The signal amplified by the auxiliary amplifier 11, shown in FIG. 10D, is input into the second phase shifter means 23, by which a phase compensation is made to restore the previous input signal phase relationship to that of the signal input the first phase shifter means 21, and the signal shown in FIG. 10E is input into the power combining means 12. That is, the second phase shifter means 23 yields an output signal produced by linearly amplifying the input signal to the first phase shifter means 21. Noting the peak portion 27 in FIGS. 10B to 10E, the peak power of the envelope power P varies in the order $P_1$-$P_2$-$GP_2$-$GP_1$, where $P_2$<$P_1$ and G is the gain of the auxiliary amplifier 11.

Figure 11:
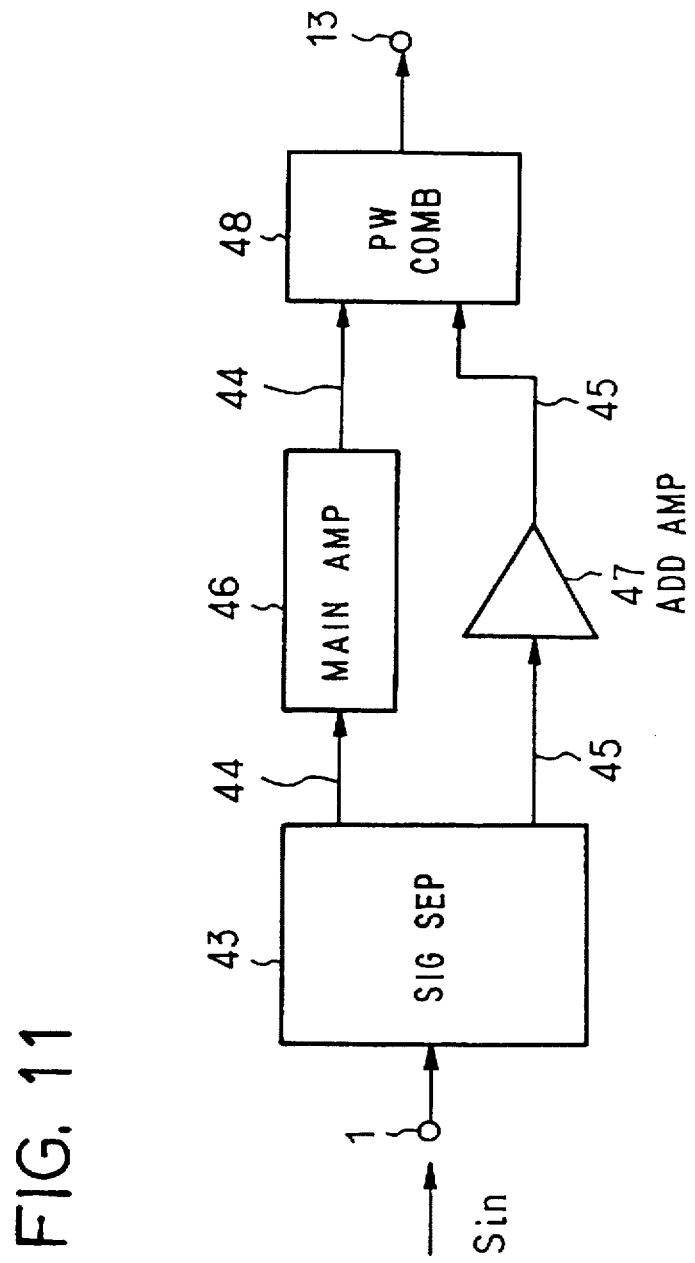
FIG. 11 is a block diagram illustrating another embodiment of the present invention.
Figure 12A:
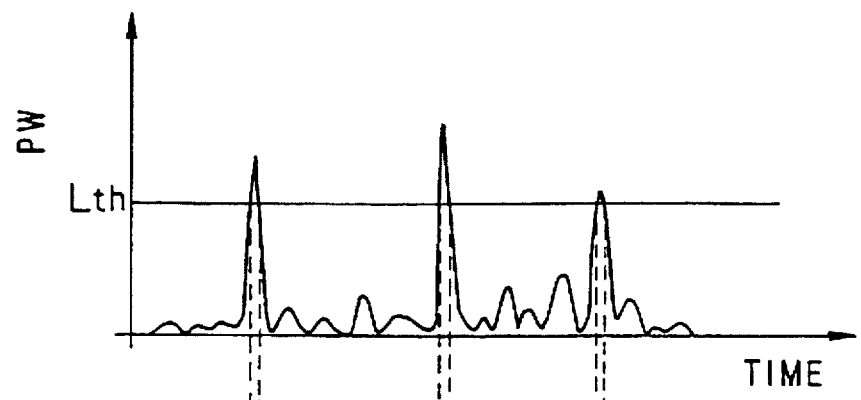
FIGS. 12A–12C (hereinafter collectively referred to as "FIG. 12") are waveform diagrams showing examples of signal envelope power waveforms occurring at respective parts in FIG. 11.
Figure 12B:
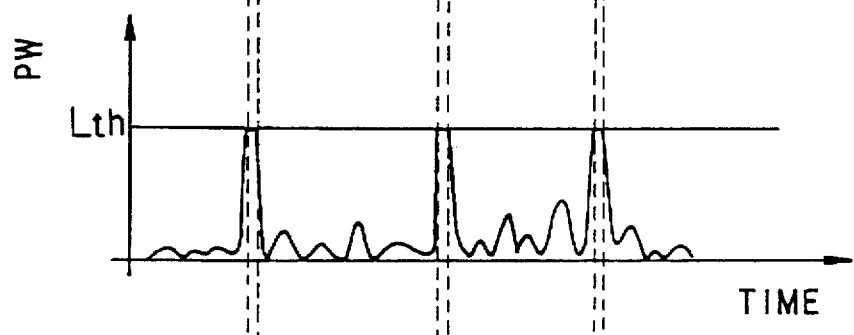

The high PEP portion of the input signal imposes severe requirement of the amplifier and causes distortion. It is possible, therefore, to solve this problem by amplifying the input signal after separating it into a main signal having its envelope power limited to a predetermined value or below and a signal of the difference between the main signal and the input signal. This is the second aspect of the present invention. That is, as illustrated in FIG. 11, the input signal Sin at the input terminal 1 is fed to signal separator means 43, wherein it is separated into the main signal having its envelope power limited to a predetermined value (a threshold value Lth) and the difference signal corresponding to the difference between the input signal and the main signal and from which they are provided on a main signal path 44 and a difference signal path 45. In FIGS. 12A, B and C, there are shown examples of envelope power waveforms of the input signal, the main signal and the difference signal, respectively. In the main signal path 44 and the difference signal path 45 there are provided a main amplifier 46 and an auxiliary amplifier 47, respectively. Now, let it be assumed that the main amplifier 46 is an amplifier of excellent linearity, for example, a feedforward amplifier. The signals amplified by the main amplifier 46 and the auxiliary amplifier 47 are linearly combined by power combining means 48, from which the combined output is provided to the output terminal 13. The power combining means 48 is formed by a transformer circuit or hybrid circuit.

In this embodiment the envelope power of the main signal is limited to the value Lth to prevent an increase of the peak power, and the threshold value Lth is set at a value smaller than the input power value corresponding to the saturation output power of the main amplifier 46; therefore, it is possible to achieve high efficiency operation of the main amplifier 46 and linear amplification of the main signal. When the threshold value Lth is set to be several times larger than the average power of the input signal, the ratio of the time during which the envelope power level of the input signal exceeds the value Lth, that is, the time during which the difference signal is generated, to the overall time is on the order of $10^{-5}$; hence, the influence of distortion by the amplification of the difference signal is slight.

In the prior art that employs only one amplifier, its saturation output power is chosen to be around 10 times larger than the average power of the output signal. Now, let it be assumed that the above-mentioned threshold value Lth is five to six times larger than the average power of the input in the prior art.

In order to confirm the above-mentioned effects of the present invention, the following computer simulations were performed. As the input signal to the first phase shifter means, N=32 sine-wave carrier signals of randomly set initial phases were used and simulations were performed on 10000 combinations of their initial phases. The aforementioned phase characteristic was used as the phase shift amount-vs.-frequency characteristic of the first phase shifter means 21 and the coefficient given by the following equation was used:

$$\alpha = \pi/((N-1)\Delta f^2)$$

Figure 13:
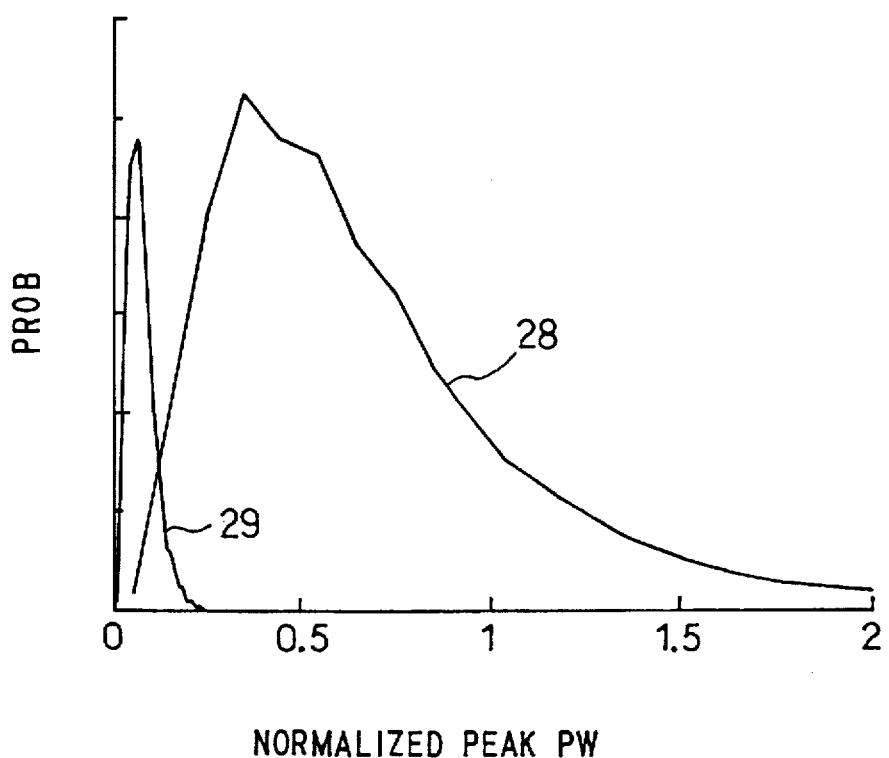
FIG. 13 is a graph showing simulation results on the probability distribution of the peak envelope power of each of the input signal to and the output signal from the first phase shifter means, for explaining the effect of the present invention.

That is, $\Delta f$ is the carrier frequency interval and $B=(N-1)\Delta f$, $T=1/\Delta f$. In FIG. 13 the curves 28 and 29 indicate the peak power distributions of input and output signals of the first phase shifter means 21 obtained by the simulations. The abscissa represents the peak power of the multicarrier signal normalized by the average power of the input multicarrier signal, and the ordinate represents the probability of occurrence of the peak power. The input signal has a high probability of occurrence with respect to a large PEP, whereas the output signal occurs when the PEP is 0.2 or below, that is, no large PEP appears. The mean value of the PEP of the output signal is about 1/10 that of the input signal. This means that the required saturation output of the auxiliary amplifier 47 can be reduced down to approximately 1/10. In this way, the present invention amplifies the input signal in such a state that no large peak power would appear, and hence it permits reduction of the saturation power of the amplifier and eliminates the possibility of signal distortion.

Figure 14:
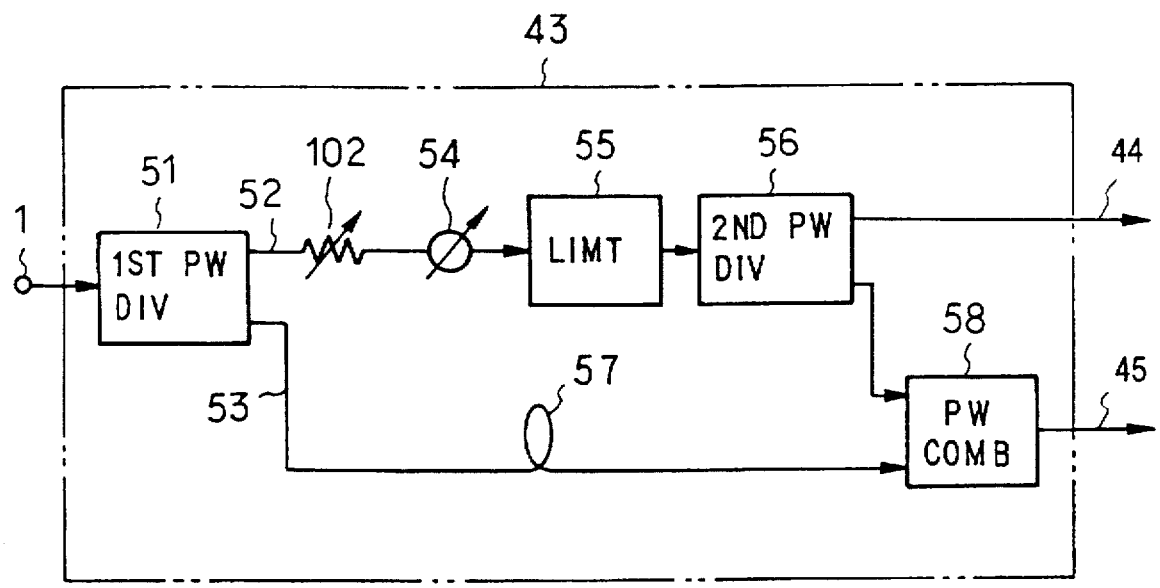
FIG. 14 is a block diagram illustrating a concrete example of signal separator means 43 in FIG. 11.

FIG. 14 illustrates a concrete example of the signal separator means 43, in which the input signal from the input terminal 1 is branched by first power divider means 51 to a limiter path 52 and a linear path 53. In the limiter path 52 there is provided a series connection of a variable attenuator means 102, variable phase shifter means 54, a limiter 55 and second power divider means 56. The second power divider means 56 divides its input signal into two, one of which is fed to the main signal path 44. In the linear path 53 there is provided delay means 57, and the signal delayed by the delay means 57 and the other output from the second power divider means 56 are combined by power combining means 58, whose output is provided to the difference signal path 45. The power dividing ratios of the first and second power divider means 51 and 56, the power combining ratio of the power combining means 58, the amount of attenuation of the variable attenuator means 102, the phase shift amount of the variable phase shifter means 54 and the amount of delay of the delay means 57 are adjusted or regulated so that the signals input into the power combining means 58 from the limiter path 52 and the linear path 53 are combined in opposite phases to generate a desired difference signal.

The limiter 55 can be formed by a PIN diode limiter circuit. The variable attenuator means 52 can be formed using a PIN diode, and the variable phase shifter means 54 can be formed by a circulator, varactor diode, or the like; commercially available products can be used for both of them. The delay means 57 can be formed using a delay line.

Figure 15:
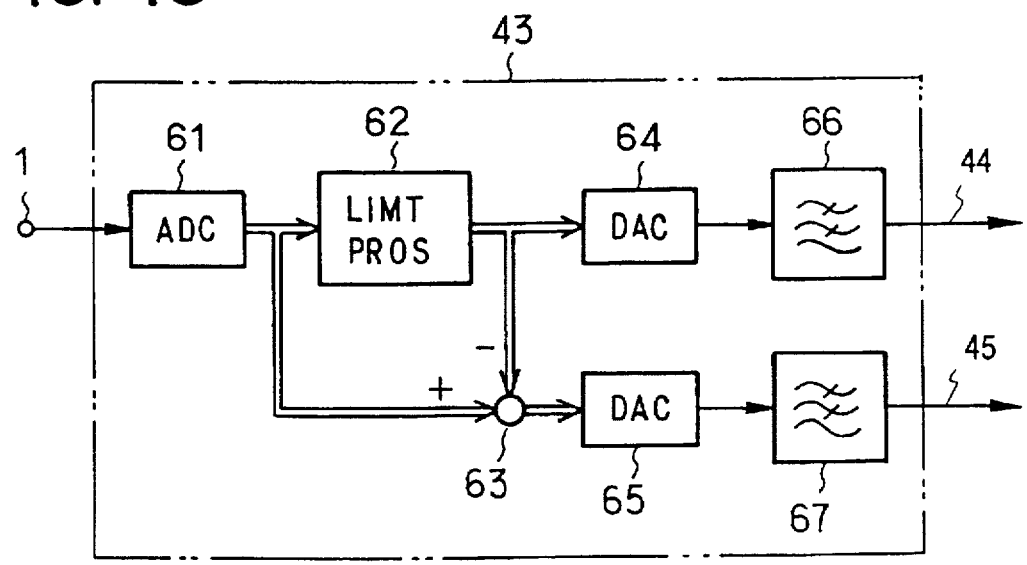
FIG. 15 is a functional block diagram illustrating another concrete example of the signal separator means 43 in FIG. 11.

Another concrete example of the signal separator means 43 is shown in FIG. 15. The input signal is converted by an analog-to-digital converter (AD converter) 61 to a digital signal, which is fed to limiting processing means 62, from which a digital value larger than the threshold value Lth is output as Lth and a value smaller than the threshold value Lth is output intact as a digital main signal. This digital main signal is subtracted by subtracting means 63 from the output digital signal from the AD converter 61 to obtain a digital difference signal. The digital main signal and the digital difference signal are converted by DA converters 64 and 65 to analog signals, which are applied to low-pass filters 66 and 67 to remove their undesired frequency components, and the filter outputs are provided to the main signal path 44 and the difference signal path 45. The functions of the limiting processor means 62 and the difference means 63 can be performed by a microprocessor.

Figure 16:
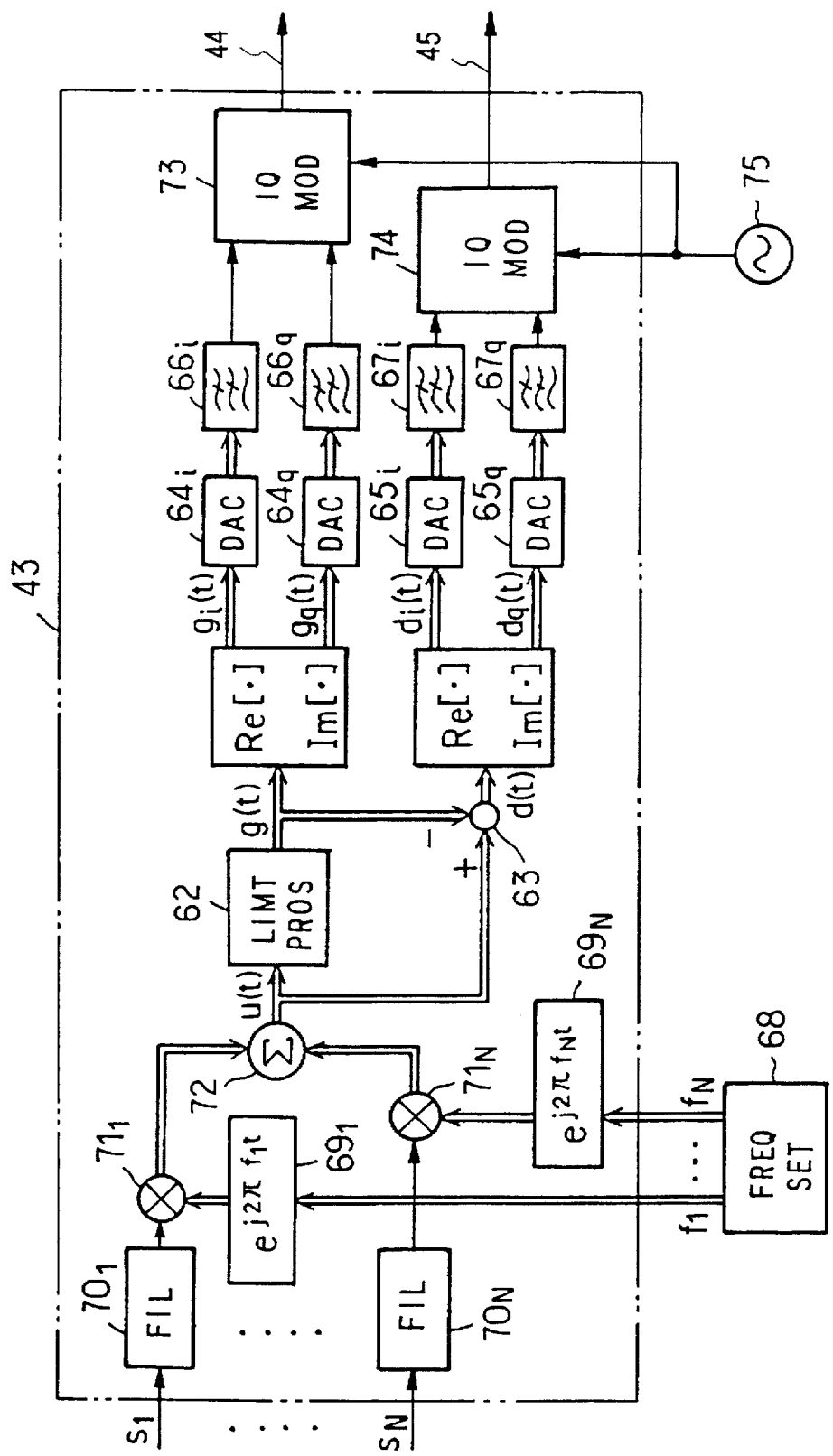
FIG. 16 is a block diagram showing concrete functional configurations of the signal separator means 43 and a multicarrier signal generating part.

In FIG. 16 there is illustrated an example in which a digital multicarrier signal is generated by digital signal processing and digital main and difference signals are derived from the digital multicarrier signal and are converted to analog main and difference signals. Data indicative of respective carrier frequency $f_k$ (where $k=1, 2, \ldots, N$) is set by frequency setting means 68 and is used to generate a complex digital carrier signal $\exp(j2\pi f_k t)$ by carrier signal generator means 69k. On the other hand, complex symbol data sk of a k-th channel is band limited by a filter 70k and then it is multiplied by the complex digital carrier signal $\exp(j2\pi f_k t)$ by a multiplier 71k. These k complex-multiplication results are added by adder means 72 to generate a complex multicarrier signal u(t). The complex multicarrier signal u(t) is divided by the limiting processor means 62 and the difference means 63 into a digital complex main signal g(t) and a digital difference signal d(t) as in the case of FIG. 15.

The in-phase component (the real part) $g_i(t)$ and quadrature-phase component (the imaginary part) $g_q(t)$ of the complex main signal and the in-phase component (the real part) $d_i(t)$ and quadrature component (the imaginary part) $d_q(t)$ of the complex difference signal d(t) are converted by DA converters 64i, 64q and 65i, 65q to analog signals, and their high-frequency components are removed by low-pass filters 66i, 66q and 67i, 67q, respectively. The outputs from the filters 66i and 66q and the outputs from the filters 67i and 67q are applied to quadrature modulators 73 and 74, wherein they are quadrature-modulated by a local signal from a local oscillator 75 into high-frequency main and difference signals, which are supplied to the main signal path 44 and the difference signal path 45, respectively.

The above-mentioned signals will be described below in the form of equations. Letting the amplitude component and phase component of the baseband signal obtained by band-limited symbol data {sk} be represented by ak(t) and φk(t), respectively, the complex multicarrier signal u(t) can be expressed by the following equation:

$$u(t) = \Sigma_{k=1}^{N} a_k(t) \exp[j2\pi f_k + \phi_k(t)]$$
$$= A(t)\exp[j\Phi(t)]$$
$$A(t) = |u(t)|, \Phi(t) = \arg[u(t)]$$

Letting the amplitude used as the threshold value be represented by L, the complex main and difference signals can be expressed by the following equations:

$$|u(t)| \leq L, \quad g(t)=u(t)$$

$$|u(t)| > L, \quad g(t)=L\exp[j\Phi(t)] d(t)=u(t)-g(t)$$

The real and imaginary parts as the in-phase and quadrature components of these complex signals are derived as in-phase and quadrature components of the base band signals.

$$g_i(t)=\text{Re}[g(t)], g_q(t)=\text{Im}[g(t)]$$
$$d_i(t)=\text{Re}[d(t)], d_q(t)=\text{Im}[d(t)]$$

The base band signals are input into the quadrature modulators 73 and 74, wherein they quadrature modulate a carrier of the frequency $f_0$ and from which are output the signals expressed by the following equations:

$$g(t)=\text{Re}[g(t)\exp(j2\pi f_0 t)]$$
$$d(t)=\text{Re}\{d(t)\exp(j2\pi f t)\}$$

Figure 17:
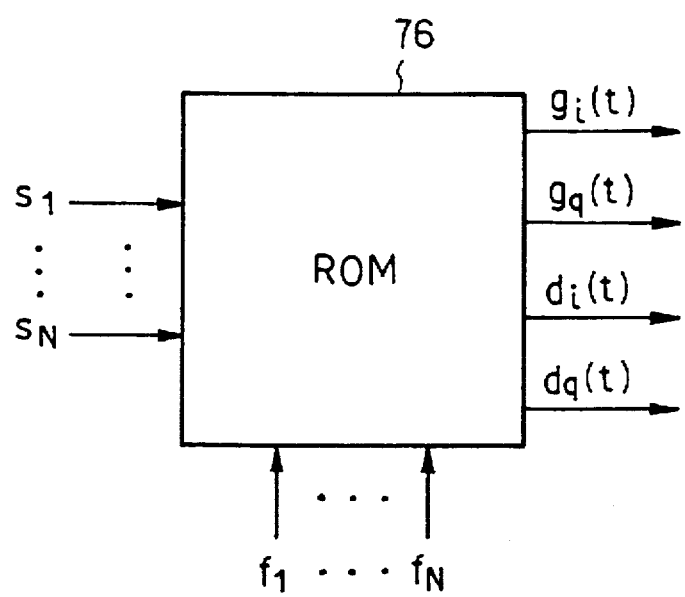
FIG. 17 is a block diagram showing another example of the multicarrier signal generating part.

In the signal separating type multicarrier signal generator shown in FIG. 16, data on each input carrier frequency {fk} and the symbol data {sk} are used to sequentially calculate the main signal component g(t) and the difference signal component d(t). This calculation is usually performed by a microprocessor. It is also possible to employ a configuration in which the base band main and difference signals are precalculated for combinations of the data {fk} and {sk} and prestored in a ROM or similar storage element 76 and waveform data of each of the main and difference signals is read out therefrom in accordance with the data {fk} and {sk} as shown in FIG. 17.

Figure 18:
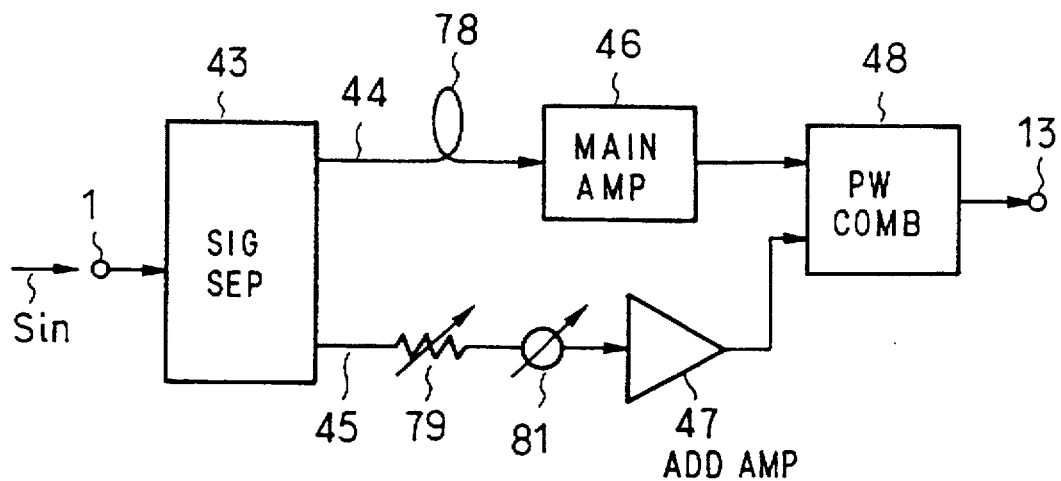
FIG. 18 is a block diagram showing a modified form of the FIG. 11 embodiment.

In FIG. 18 there is illustrated a modified form of the FIG. 11 embodiment, in which delay means 78 is placed at the input side of the main amplifier 46 and a series connection of variable attenuator means 79 and variable phase shifter means 81 is provided at the input side of the auxiliary amplifier 47. The delay means 78, variable attenuator means 79 and the variable phase shifter means 81 are provided to correct mismatching of amplitude and phase in the power combining means 48 which arises from transmission characteristics of the main amplifier 46 and the auxiliary amplifier 47. These means need not always be disposed at the positions specified in FIG. 18 but may also be inserted in the main signal path 44 and the difference signal paths 45 at any positions where the above-mentioned effect can be obtained. All of the delay means 78, the variable attenuator means 79 and the variable phase shifter means 81 need not always be employed but required ones of them may be inserted to meet actual circuit characteristics of the main amplifier 46 and the auxiliary amplifier 47.

Figure 19:
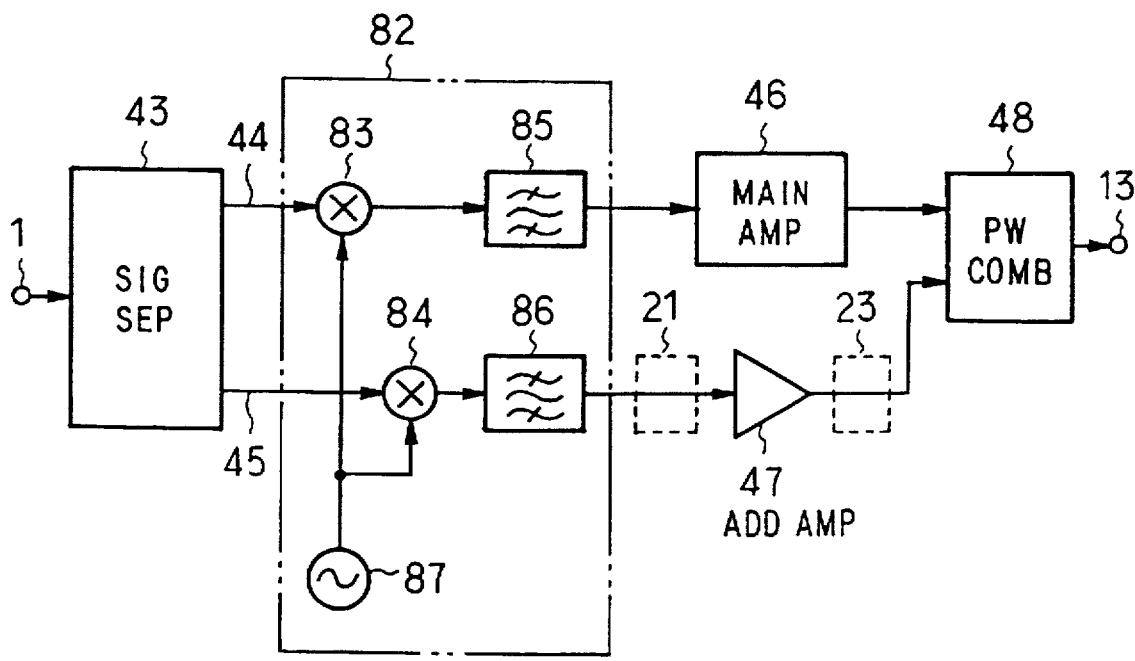
FIG. 19 is a block diagram showing another modified form of the FIG. 11 embodiment.

FIG. 19 illustrates another modified form of the FIG. 11 embodiment, in which frequency converting means 82 is provided at the input side of the main amplifier 46 and the auxiliary amplifier 47. The frequency converting means 82 is made up of mixers 83 and 84 and band-pass filters 85 and 86 provided for the main signal path 44 and the difference signal path 45, respectively, and a local oscillator 87 provided in common to them. The circuit configuration containing the frequency converting means 82 is effective when a circuit provided at the stage preceding the signal separator means 43 or input terminal 1 is operated at a low frequency or low speed.

Figure 12C:
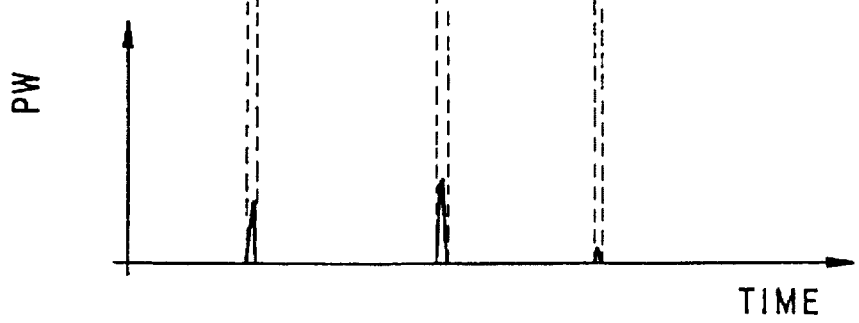
Figure 20:
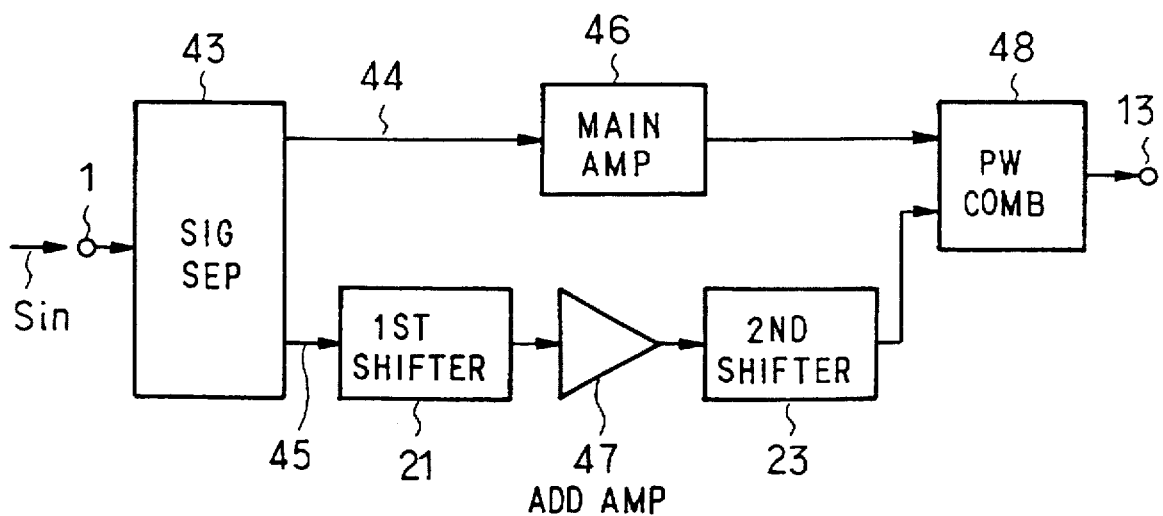
FIG. 20 is a block diagram showing still another modified form of the FIG. 11 embodiment.

FIG. 20 shows the application of the first aspect of the invention to the FIG. 11 embodiment. In the difference signal path 45 at the input and the output side of the auxiliary amplifier 47, there are provided the first and second phase shifter means 21 and 23 used in the FIG. 3 embodiment. The difference signal separated by the signal separator means 43 is a sharp pulse-like signal as depicted in FIG. 12C, but the respective frequency components of the difference signal, which are substantially in phase with one another as referred to previously, are phased apart by the first phase shifter means 21, with the result that the peak power is reduced. The difference signal of the thus diminished peak power is amplified by the auxiliary amplifier 47, then the phases of the respective frequency components of the amplified output signal are shifted by the second phase shifter means 23 into the same as at the input of the first phase shifter means 21, thereby obtaining a linearly amplified version of the difference signal separated by the signal separator means 43.

Figure 21:
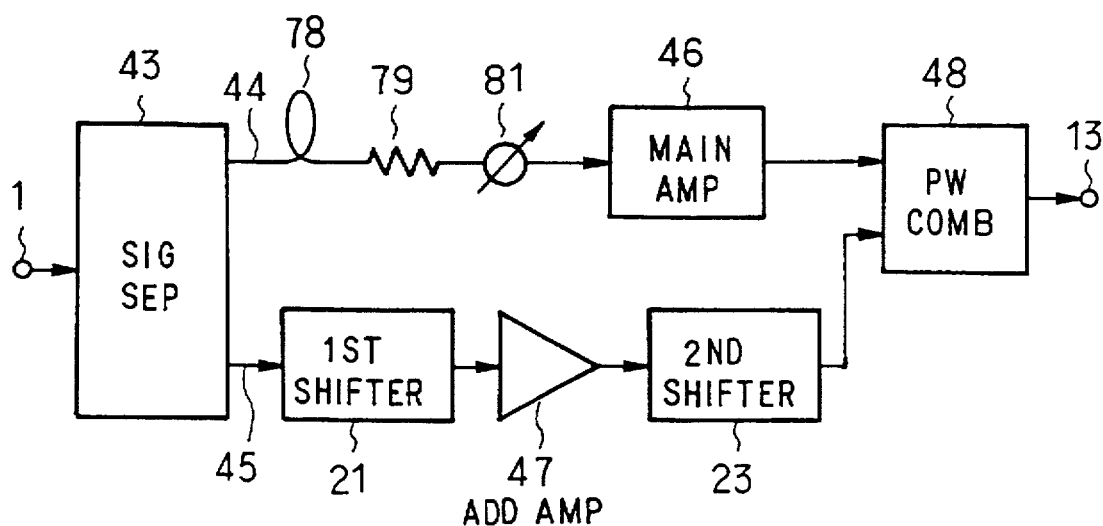
FIG. 21 is a block diagram showing a further modified form of the FIG. 20 modification.

FIG. 21 shows a modification of the FIG. 20 embodiment in which, as is the case with the FIG. 18 embodiment, the delay means 78, the attenuator means 79 and the phase shifter means 81 are provided in the main signal path 44 between the signal separator means 43 and the main amplifier 46 to compensate for the influence of a delay, an attenuation and a phase shift by each of the first and second phase shifter means 21 and 23. The delay means 78, the attenuator means 79 and the phase shifter means 81 need not always be placed specifically at the positions indicated in FIG. 21 but may also be disposed in the main signal path 44 and the difference signal path 45 at any positions where the above-mentioned effect can be produced. All of the delay means 78, the attenuator means 79 and the phase shifter means 81 need not always be provided but required one or ones of them are provided in accordance with the actual circuit characteristics of the first and second phase shifter means 21 and 23.

Figure 22:
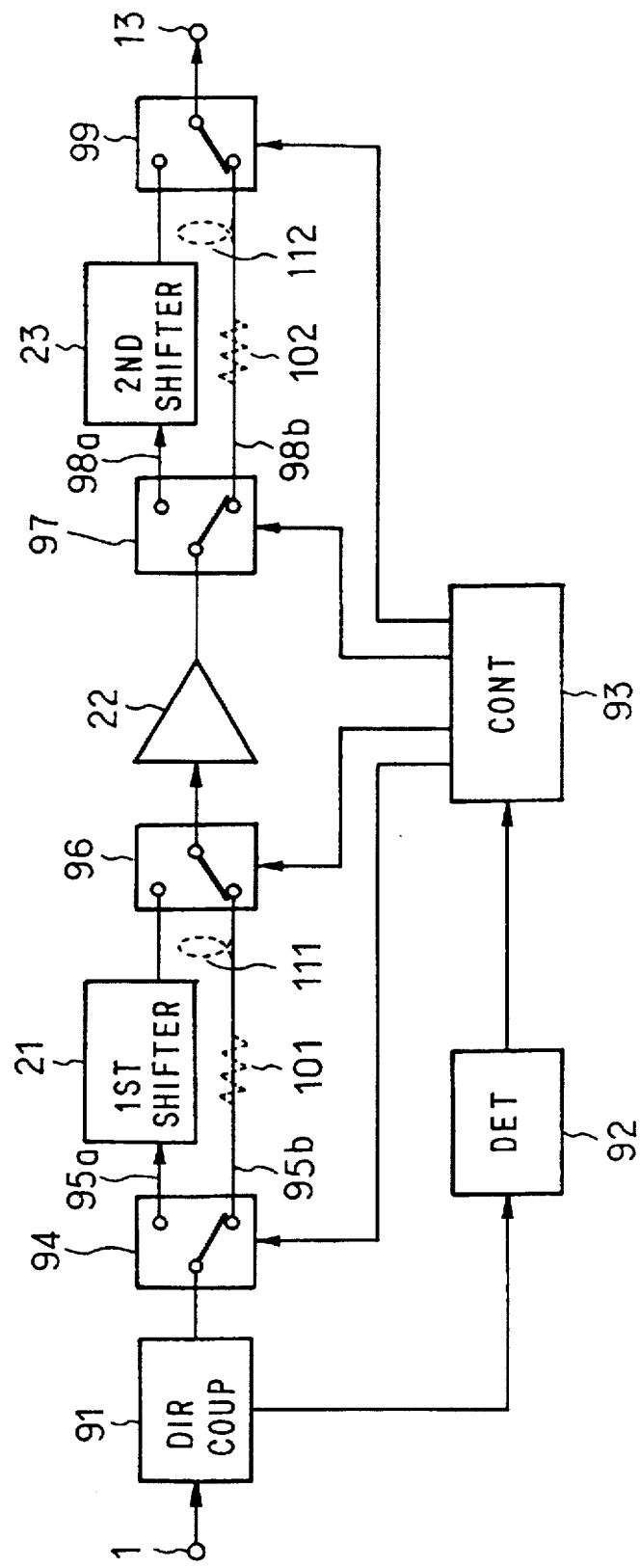
FIG. 22 is a block diagram illustrating an embodiment of the present invention according to the third aspect of the present invention.

Turning next to FIG. 22, a description will be given of another embodiment of the present invention in which only that portion of the input signal which has a PEP larger than a predetermined value passes through a path composed of the first phase shifter, the amplifier and the second phase shifter, whereas the input signal portion of smaller PEP passes through the amplifier alone. The signal applied to the input terminal 1 is branched by a directional coupler 91 into two, one of which is fed to detecting means 92 for detecting the signal envelope power and the detected signal is applied to control means 93. The other output from the directional coupler 91 is applied to first switching means 94, from which it is fed to one end of input path 95a or 95b. Either one of the input paths 95a and 95b are selectively connected at the other end to the amplifier 22 by second switching means 96. The output from the amplifier 22 is provided via third switching means 97 to one end of an output path 98a or 98b. The output paths 98a and 98b are selectively connected at the other end to the output terminal 13 via fourth switching means 99. The one input path 95a includes the first phase shifter means 21 and the one output path 98a includes the second phase shifter means 23. The first and second phase shifter means 21 and 23 are the same as those used in the FIG. 3 embodiment.

The envelope power of the input signal is detected by the detecting means 92 and the detected output is applied to the control means 93. When the PEP value L of the input signal is smaller than the threshold value Lth, the control means 93 controls the first through fourth switching means 94, 96, 97 and 99 to permit the passage of the signal through the input path 95b and the output path 98b. When the PEP value L is larger than the threshold value L, the control means 93 controls the first through fourth switching means 94, 96, 97 and 99 so that the signal passes through the input path 95a and the output path 98a. The control means 93 switches the input and output paths with a period corresponding to a reciprocal of the frequency interval Δf, for instance. That is, when the PEP of the input signal in one cycle (1/Δf) prior to the switching timing exceeds the threshold value Lth, the control means 93 controls the first through fourth switching means 94, 96, 97 and 99 to permit the passage of the input signal through the input path 95a and the output path 98a. When the PEP is smaller than the threshold value Lth, the control means 93 controls the first to fourth switching means 94, 96, 97 and 99 to permit the passage of the signal through the input path 95b and the output path 98b.

The detecting means 92 is formed using, for example, a diode, capacitor, resistor, or similar element. The control means 93 can be formed by an AD converter, microprocessor, ROM, RAM DA converter or the like. Alternatively, it can also be formed by an analog circuit using an operational amplifier, resistor or the like. The first to fourth switching means 94, 96, 97 and 99 are formed by semiconductor switches, for instance. The operation of this amplifying apparatus will be described below.

Figure 23A:
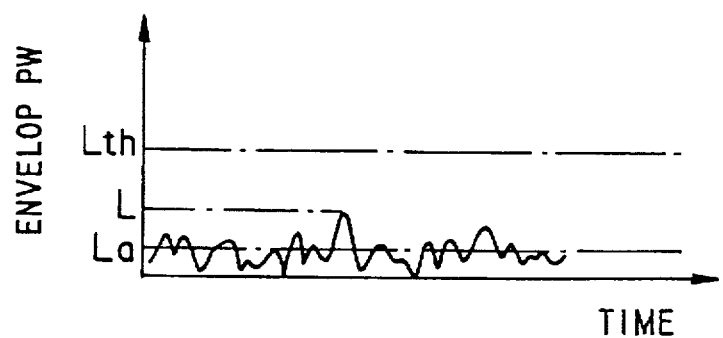
FIGS. 23A–23B (hereinafter collectively referred to as "FIG. 23") are waveform diagrams for explaning the operation of the FIG. 22 embodiment.
Figure 23B:
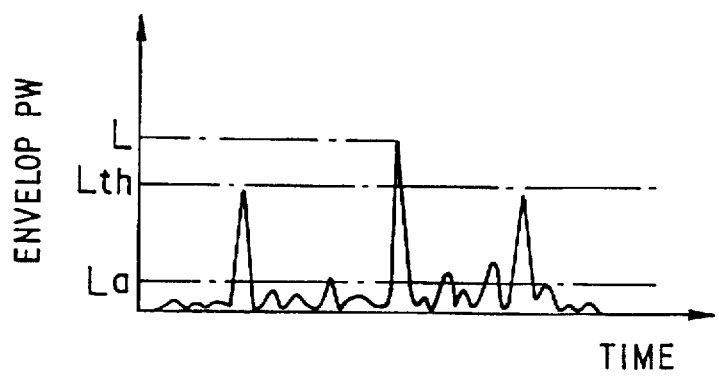

FIGS. 23A and 23B show examples of the envelope power waveforms of the input signal at the input terminal 1. FIG. 23A shows an example when the PEP value L is smaller than the threshold value Lth, in which case the signal passes through the input path 95b and the output path 98b and the amplifying apparatus performs the same amplifying operation as does the conventional apparatus. The threshold value Lth is set in accordance with the saturated output power of the amplifier 22; the threshold value Lth is set such that when the PEP value L is smaller than the threshold value Lth, the distortion based on the saturation characteristic of the amplifier 22 becomes 60 dB or more in terms of the signal-to-distortion power ratio, for instance. FIG. 23B shows the case where the PEP value L is larger than the threshold value Lth, in which case the signal passes through the input path 95a and the output path 98a and is amplified accordingly. In this instance, as described previously, the phases of respective frequency components of the input signal are shifted by the first phase shifter means 21 relative to one another and consequently the PEP is reduced, then the output from the first phase shifter 21 is applied to the amplifier 22. The output from the amplifier 22 is phase-shifted by the second phase shifter means 23 so that the relative phases of the respective frequency components become the same as in the input signal at the input terminal 1. As a result, a linearly amplified output is obtained at the output terminal 13 even if the signal has a large PEP value.

While in the above the first to fourth switching means 94, 96, 97 and 99 have been described to be controlled depending on whether the PEP value of the input signal is larger than the threshold value Lth, they can also be controlled following an instantaneous change of the envelope power that is detected by the detecting means 92. In this instance, the first to fourth switching means 94, 96, 97 and 99 are controlled so that the input path 95b and the output path 98b are normally selected and, upon detection of a power level higher than the threshold value Lth by the detecting means 92, they are switched to the input path 95a and the output path 98a, which are switched again to the signal paths 95b and 98b after a certain elapsed time. This certain elapsed time is about the peak envelope width and can be chosen to be nearly equal to a reciprocal of the bandwidth of the multicarrier signal.

When the first or second phase shifter means 21 or 23 causes an attenuation bias, attenuator means of the same attenuation as the attenuation bias is provided in the input or output paths 95b or 98b. Similarly, when the first or second phase shifter 21 or 23 develops a delay (the respective frequency components being equally delayed), delay means of the same delay as the above-mentioned is provided in the input or output path 95b or 98b. For example, as indicated by the broken lines FIG. 22, attenuator means 101 and delay means 111 are provided in the input path 95b, whereas in the output path 98b attenuator means 102 and delay means 112 are provided.

Figure 24:
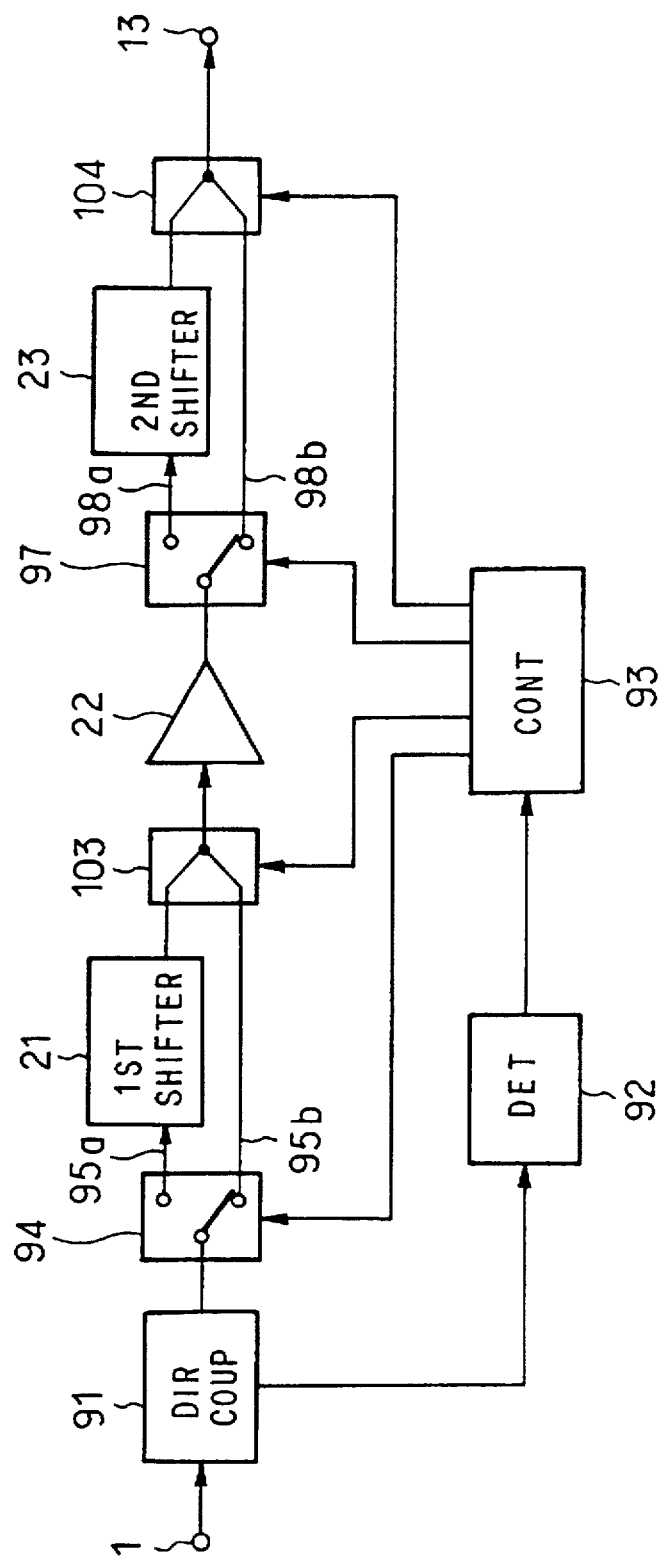
FIG. 24 is a block diagram illustrating another embodiment according to the third aspect of the present invention.
Figure 25:
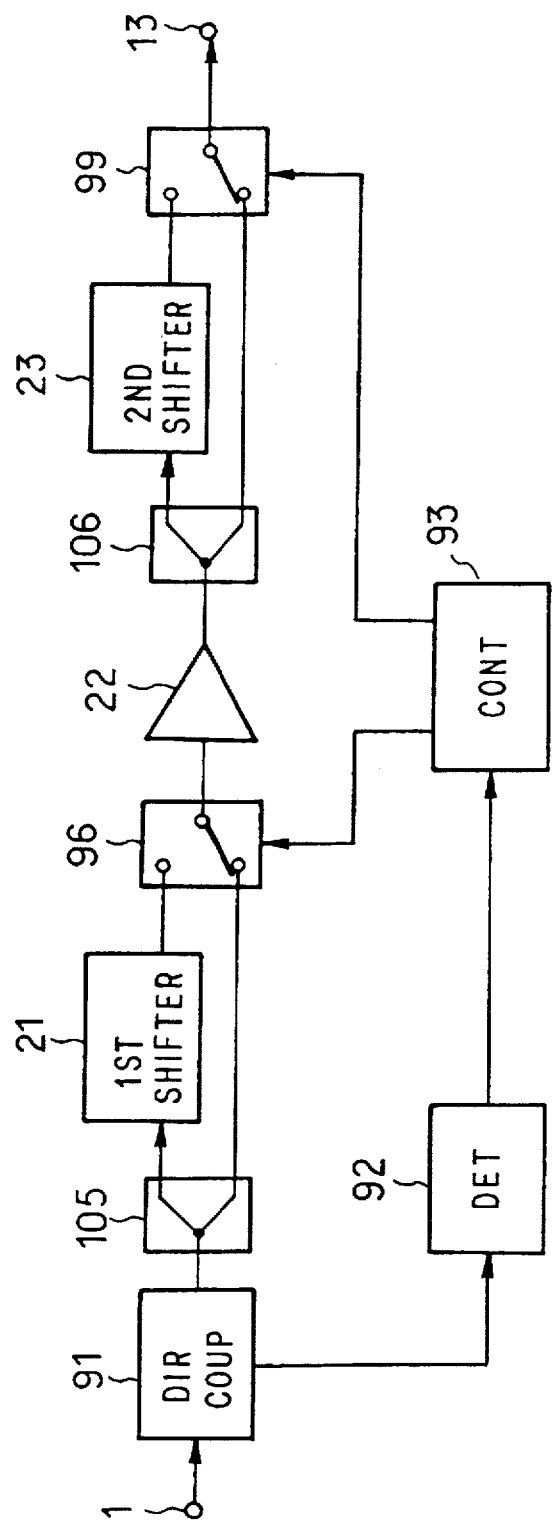
FIG. 25 is a block diagram illustrating still another embodiment according to the third aspect of the present invention.

As depicted in FIG. 24, the second switching means 96 and the fourth switching means 99 in FIG. 22 may also be replaced with path coupling/splitting means 103 and 104, respectively. The input paths 95a and 95b are coupled by the path coupling/splitting means 103 and is connected to the amplifier 22. In this case, irrespective of which of the input paths 95a and 95b is selected by the first switching means 94, the signal passing through the selected input path is input into the amplifier 22. The path coupling/splitting means 104 also provides the signal passing through the selected output path to the output terminal 13, no matter which of the output paths 98a and 98b is selected. Incidentally, it is also possible to replace only one of the switching means with the path coupling/splitting means. As shown in FIG. 25, the first and third switching means 94 and 97 in FIG. 22 may also be substituted with path coupling/splitting means 105 and 106, respectively. Of course, either one of the switching means may be substituted with the path coupling/splitting means.

The present invention is suitable for use in amplifying a signal containing a large peak in its envelope power as well as the multicarrier signal.

As described above, according to the present invention, since the peak value of the input signal is reduced by the first phase shifter means prior to the application of the signal to the amplifier, it is possible to use a low-cost and small amplifier whose saturation power is relatively small. The amplifier output is processed by the second phase shifter means to have the same envelope power waveform as that of the input signal, that is, a linearly amplified output signal can be obtained.

With the application of the present invention to the auxiliary amplifier of the feedforward amplifier, the required saturation power of the main amplifier can be made relatively small.

By separating the input signal into a main signal whose envelope power is limited to a value smaller than a predetermined one and a signal corresponding to the different between input signal and the main signal, and by combining the main and difference signals after amplifying them by the main amplifier and the auxiliary amplifier, respectively, the required saturation power of the main amplifier can be made relatively small. In this instance, the provision of the first and second phase shifter means before and after the auxiliary amplifier reduces its required saturation power and ensures the generation of an output signal of excellent linearity.

The required saturation power of the amplifier can similarly be reduced by applying the input signal to the amplifier directly or through the first phase shifter means, depending on whether the envelope power of the input signal is below or above a threshold value.

It will be apparent that many modifications and variations may be effected without departing from the novel concepts of the present invention.

What is claimed is:

1. An amplifying device comprising:
   first phase shifter means connected at its input end to an input terminal and having a nonlinear phase amount-vs.-frequency characteristic;
   signal separator means for separating an input signal fed to said input terminal into a main signal and a difference signal and for applying said difference signal to said first phase shifter means and said main signal to a first signal path;
   an amplifier having its input end connected to the output end of said first phase shifter means;
   second phase shifter means having its input end connected to the output end of said amplifier and having an output end providing an output signal, said second phase shifter means having a phase shift amount-vs.-frequency characteristic substantially opposite to that of said first phase shifter means;
   an output terminal; and
   first power combining means which combines said main signal from said first signal path and said output signal from said second phase shifter means and provides the combined output to said output terminal.

2. The amplifying device of claim 1, wherein said signal separator means comprises: power divider means for distributing said input signal to first and second branch terminals; a main amplifying path and a linear path connected at one end to said first and second branch terminals; a directional coupler connected to the other ends of said main amplifying path and said linear path, for supplying a signal from said main amplifying path as said main signal to said first signal path, for detecting the difference between said signal from said main amplifying oath and a signal from said linear path, and for applying said difference as said difference signal to said first phase shifter means; a main amplifier inserted in said main amplifying path; and first delay means inserted in said linear path;
   which further comprises:
      second delay means inserted in said first signal path; and
      wherein said difference signal is supplied to a distortion amplifying path formed by a series connection of said first phase shifter means, said amplifier and said second phase shifter means and said difference signal from said distortion amplifying path and a distortion component in said signal from said first signal path are combined by said first power combining means in opposite phases.

3. The amplifying device of claim 2, wherein at least one of said main amplifying path and said linear path includes at least one of variable attenuator means and variable phase shifter means and at least one of said first signal path and said distortion amplifying path includes at least one of variable attenuator means and variable phase shifter means.

4. The amplifying device of claim 1, wherein said signal separator means is a means for separating said input signal into said main signal having its envelope power limited to be smaller than a predetermined value and said difference signal corresponding to the difference between said main signal and said input signal, and
   which further comprises a main amplifier inserted in said first signal path.

5. The amplifying device of claim 4, wherein said signal separator means comprises: first power divider means for distributing said input signal to first and second branch terminals; a limiter connected to said first branch terminal of said first power divider means, for removing the envelope power of said input signal which is larger than said predetermined value; second power divider means for dividing the output signal from said limiter into two output signals, and for outputting one of them as said main signal; delay means connected to said second branch terminal of said first power divider means; and second power combining means for combining the output signal from said delay means and the other branched output signals from said second power divider means in opposite phases to obtain said difference signal.

6. The amplifying device of claim 5, further comprising at least one of variable attenuator and variable phase shifter means connected in series to at least one of said limiter and said delay means.

7. The amplifying device of claim 4, wherein said signal separator means comprises: an AD converter for converting said input signal to a digital signal; means for removing the envelope power of said digital signal above a predetermined value to obtain a digital main signal having the envelope power of said predetermined value; means for subtracting said digital main signal from said digital signal to obtain a digital difference signal; first and second DA converters for converting said digital main signal and said digital difference signal to analog signals, respectively; and first and second low-pass filters for band limiting said analog signals from said first and second DA converters to obtain said main signal and said difference signal.

8. The amplifying device of any one of claims 4 to 7, further comprising frequency converting means provided at the input side of said main amplifier and at the input side of said first phase shifter means, for up-converting of said main signal and said difference signal.

9. The amplifying device of claim 4, wherein said input signal is a multicarrier signal;
   which further comprises frequency setting means for setting frequency data indicating the frequency of each carrier signal in first to N-th channels, said N being an integer equal to or greater than 2; and
   wherein said signal separator means comprises: carrier signal generating means for generating, for each of said first to N-th channel, a complex digital carrier signal of a frequency corresponding to said set frequency data;

multiplying means for multiplying said complex digital carrier signals of said first to N-th channels by complex symbol data of said first to N-th channels; adding means for adding the N complex multiplication results to obtain a digital signal of said multicarrier signal; means for removing the envelope power of said digital multicarrier signal above a predetermined value to obtain a digital main signal having the envelope power of said predetermined value; means for subtracting said digital main signal from said digital multicarrier signal to obtain a digital difference signal; means for converting real and imaginary parts of said digital main signal to analog signals; means for quadrature modulating a radio frequency (RF) carrier signal with said analog signals to obtain said main signal; means for converting real and imaginary parts of said digital difference signal to analog signals; and means for quadrature modulating said RF carrier signal with said analog signals to obtain said difference signal.

10. The amplifying device of any one of claims 4 to 7 and 9, further comprising transmission characteristic adjusting means provided in at least one of said first signal path and a second signal path formed by said first phase shifter means, said amplifier and said second phase shifter means, for making uniform the transmission characteristics of said first and second signal paths.

11. An amplifying device comprising:

first phase shifter means connected at its input end to an input terminal and having a nonlinear phase amount-vs.- frequency characteristic;

an amplifier having its input end connected to the output end of said first phase shifter means;

second phase shifter means having its input end connected to the output end of said amplifier and having its output end connected to an output terminal, said second phase shifter means having a phase shift amount-vs.-frequency characteristic substantially opposite to that of said first phase shifter means;

first switching means for selectively connecting said input terminal to one end of a first input path and one end of a second input path having said first phase shifter means inserted therein;

second switching means for selectively connecting the other end of said first input path and the other end of said second input path to the input end of said amplifier;

third switching means for selectively connecting one end of a first output path and one end of a second output path having said second phase shifter means inserted therein to the output end of said amplifier;

fourth switching means for selectively connecting the other end of said first output path and the other end of said second output path to said output terminal;

detecting means for detecting the envelope power of said input signal; and control means for comparing said detected envelope power with a threshold value and for connecting said first and second switching means to said second input path and said third and fourth switching means to said second output path when said envelope power exceeds said threshold value.

12. An amplifying device comprising:

first phase shifter means connected at its input end to an input terminal and having a nonlinear phase amount-vs.- frequency characteristic;

an amplifier having its input end connected to the output end of said first phase shifter means;

second phase shifter means having its input end connected to the output end of said amplifier and having its output end connected to an output terminal, said second phase shifter means having a phase shift amount-vs.-frequency characteristic substantially opposite to that of said first phase shifter means;

first switching means for selectively connecting said input terminal to one end of a first input path and one end of a second input path having said first phase shifter means inserted therein;

first path coupling means for connecting the other end of said first input path and the other end of said second input path to the input end of said amplifier;

second switching means for selectively connecting one end of a first output path and one end of a second output path having said second phase shifter means inserted therein to the output end of said amplifier;

second path coupling means for connecting the other end of said first output path and the other end of said second output path to said output terminal;

detecting means for detecting the envelope power of said input signal; and control means for comparing said detected envelope power with a threshold value and for connecting said first switching means to said second input path and said second switching means to said second output path when said envelope power exceeds said threshold value.

13. An amplifying device comprising:

first phase shifter means connected at its input end to an input terminal and having a nonlinear phase amount-vs.- frequency characteristic;

an amplifier having its input end connected to the output end of said first phase shifter means;

second phase shifter means having its input end connected to the output end of said amplifier and having its output end connected to an output terminal, said second phase shifter means having a phase shift amount-vs.-frequency characteristic substantially opposite to that of said first phase shifter means;

first path branching means for connecting said input terminal to one end of a first input path and one end of a second input path having said first phase shifter means inserted therein;

first switching means for connecting the other end of said first input path and the other end of said second input path to the input end of said amplifier;

second path branching means for connecting one end of a first output path and one end of a second output path having said second phase shifter means inserted therein to the output end of said amplifier;

second switching means for selectively connecting the other end of said first output path and the other end of said second output path to said output terminal;

detecting means for detecting the envelope power of said input signal; and control means for comparing said detected envelope power with a threshold value and for connecting said first switching means to said second input path and said second switching means to said second output path when said envelope power exceeds said threshold value.

14. The amplifying device of any one of claims 11 to 13, wherein said control means is a means for holding said switching means connected to said first input path and said first output path or to said second input path and said second output path, depending on the result of comparison of said envelope power and said threshold value.

15. The amplifying device of any one of claims 11 to 13, wherein said control means is a means for connecting said switching means to said second input path and said second output path and for connecting said switching means again to said first input path and said first output path after a certain elapsed time.

16. The amplifying device of any one of claims 11 to 13, further comprising attenuator means of about the same amounts of attenuation as those of said first and second phase shifter means and provided in said first input path and said first output path, respectively.

17. The amplifying device of any one of claims 11 to 13, further comprising delay means of about the same delay amounts as bias delays of said first and second phase shifter means and provided in said first input path and said first output path, respectively.

18. The amplifying device of any one of claims 2 or 5, 7, 9 and 11 to 13, wherein each of said first and second phase shifter means is a delay equalizer formed by a reactance circuit.

19. The amplifying device of claim 18, wherein said input signal is a multicarrier signal.

20. The amplifying device of any one of claims 1 or 2 to 5, 7, 9 and 11 to 13, wherein said first and second phase shifter means are each a dispersive delay line formed by a surface acoustic wave circuit.

21. The amplifying device of claim 20, wherein said input signal is a multicarrier signal.

22. The amplifying device of any one of claims 1 or 2 to 5, 7, 9 and 11 to 13, wherein said first and second phase shifter means each comprises: signal branching means for branching the input signal thereto to n signal paths, said n being an integer equal to or greater than 2; band-pass filters of different center frequencies and each inserted in one of said n signal paths; delay means inserted in said n signal paths, for delaying the output signals from said band-path filters for different time intervals; and power combining means for combining the output signals from said n signal paths into a composite output signal.

23. The amplifying device of claim 22, wherein said input signal is a multicarrier signal.

24. An amplifying device comprising:

signal separator means for separating an input signal fed to an input terminal into a main signal having its envelope power limited to a value below a predetermined value and a difference signal corresponding to the difference between said main signal and said input signal;

a main amplifier for amplifying said main signal;

an auxiliary amplifier for amplifying said difference signal; and power combining means for combining the outputs from said main amplifier and said auxiliary amplifier into a composite output for output to an output terminal;

said signal separator means comprising: first power divider means for distributing said input signal to first and second branch terminals; a limiter connected to said first branch terminal of said first power divider means, for removing the envelope power of said input signal which is larger than said predetermined value; second power divider means for dividing the output signal from said limiter into two branched output signals, and for outputting one of said two branched output signals as said main signal; delay means connected to said second branch terminal of said first power divider means; and second power combining means for combining the output signal from said delay means and the other of said two branched output signals from said second power divider means in opposite phases to obtain said difference signal.

25. The amplifying device of claim 24, further comprising at least one of variable attenuator means and variable phase shifter means connected in series to at least one of said limiter and said delay means.

26. An amplifying device comprising:

signal separator means for separating an input signal fed to an input terminal into a main signal having its envelope power limited to a value below a predetermined value and a difference signal corresponding to the difference between said main signal and said input signal;

a main amplifier for amplifying said main signal;

an auxiliary amplifier for amplifying said difference signal; and power combining means for combing the outputs from said main amplifier and said auxiliary amplifier into a composite output for output to an output terminal;

wherein said signal separator means comprises: an AD converter for converting said input signal to a digital signal; means for removing the envelope power of said digital signal above a predetermined value to obtain a digital main signal having the envelope power of said predetermined value; means for subtracting said digital main signal from said digital signal to obtain a digital difference signal; first and second DA converters for converting said digital main signal and said digital difference signal to analog signals, respectively; and first and second low-pass filters for removing undesired frequency components involved in said analog signals from said first and second DA converters to obtain said main signal and said difference signal.

27. The amplifying device of any one of claims 24, 25, or 26, further comprising frequency converting means provided at the input side of said main amplifier for increasing the frequencies of said main signal and said difference signal.

28. An amplifying device comprising:

signal separator means for separating an input signal fed to an input terminal into a main signal having its envelope power limited to a value below a predetermined value and a difference signal corresponding to the difference between said main signal and said input signal;

a main amplifier for amplifying said main signal;

an auxiliary amplifier for amplifying said difference signal; and power combining means for combing the outputs from said main amplifier and said auxiliary amplifier into a composite output for output to an output terminal;

said input signal being a multicarrier signal;

said amplifying device further comprising frequency setting means for setting frequency data indicating the frequency of each carrier signal in first to N-th channels, said N being an integer equal to or greater than 2; and said signal separator means comprising: carrier signal generating means for generating, for each of said first to N-th channels, a complex digital carrier signal of a frequency corresponding to said set frequency data; multiplying means for complex multiplying said complex digital carrier signals of said first to N-th channels by complex symbol data of said first to N-th channels; adding means for adding the N complex multiplication results to obtain a digital signal of said multicarrier signal; means for removing the envelope power of said digital multicarrier signal above a predetermined value to obtain a digital main signal having the envelope power of said predetermined value; means for subtracting said digital main signal from said digital multicarrier signal to obtain a digital difference signal; means for converting real and imaginary parts of said digital main signal to analog signals; means for quadrature modulating a high-frequency signal with said analog signals to obtain said main signal; means for converting real and imaginary parts of said digital difference signal to analog signals; and means for quadrature modulating said high-frequency signal with said analog signals to obtain said difference signal.

29. An amplifying device comprising:

first phase shifter means connected at its input end to an input terminal and having a nonlinear phase amount-vs.-frequency characteristic;

an amplifier having its input end connected to the output end of said first phase shifter means; and second phase shifter means having its input end connected to the output end of said amplifier and having its output end coupled to an output terminal, said second phase shifter means having a phase shift amount-vs.-frequency characteristic substantially opposite to that of said first phase shifter means;

each of said first and second phase shifter means being a delay equalizer formed by a reactance circuit.

30. An amplifying device comprising:

first phase shifter means connected at its input end to an input terminal and having a nonlinear phase amount-vs.-frequency characteristic;

an amplifier having its input end connected to the output end of said first phase shifter means; and second phase shifter means having its input end connected to the output end of said amplifier and having its output end coupled to an output terminal, said second phase shifter means having a phase shift amount-vs.-frequency characteristic substantially opposite to that of said first phase shifter means;

each of said first and second phase shifter means being a dispersive delay line formed by a surface acoustic wave circuit.

31. An amplifying device comprising:

first phase shifter means connected at its input end to an input terminal and having a nonlinear phase amount-vs.-frequency characteristic;

an amplifier having its input end connected to the output end of said first phase shifter means; and second phase shifter means having its input end connected to the output end of said amplifier and having its output end coupled to an output terminal, said second phase shifter means having a phase shift amount-vs.-frequency characteristic substantially opposite to that of said first phase shifter means;

each of said first and second phase shifter means comprising: signal branching means for branching the input signal thereto to n signal paths, said n being an integer equal to or greater than 2; band-pass filters of different center frequencies and each inserted in one of said n signal paths; delay means inserted in said n signal paths for delaying the output signals from said band-pass filters for different time intervals; and power combining means for combining the output signals from said n signal paths into a composite output signal.

32. An amplifying device comprising:

signal separator means for separating an input signal fed to an input terminal into a main signal having its envelope power limited to a value below a predetermined value and a difference signal corresponding to the difference between said main signal and said input signal;

a main amplifier for amplifying said main signal;

an auxiliary amplifier for amplifying said difference signal;

frequency converting means provided at the input side of said main amplifier for increasing the frequencies of said main signal and said difference signal; and power combining means for combining the outputs from said main amplifier and said auxiliary amplifier into a composite output for output to an output terminal.

* * * * *